(12) United States Patent
Iwao

(10) Patent No.: US 10,882,080 B2
(45) Date of Patent: Jan. 5, 2021

(54) SUBSTRATE PROCESSING APPARATUS AND METHOD OF PROCESSING SUBSTRATE

(71) Applicant: SCREEN Holdings Co., Ltd., Kyoto (JP)

(72) Inventor: Michinori Iwao, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 69 days.

(21) Appl. No.: 16/115,591

(22) Filed: Aug. 29, 2018

(65) Prior Publication Data

US 2019/0091733 A1    Mar. 28, 2019

(30) Foreign Application Priority Data

Sep. 22, 2017 (JP) ................. 2017-182956

(51) Int. Cl.
| | | |
|---|---|---|
| *B08B 3/04* | (2006.01) | |
| *H01L 21/02* | (2006.01) | |
| *H01L 21/687* | (2006.01) | |
| *H01L 21/67* | (2006.01) | |
| *B08B 17/02* | (2006.01) | |

(52) U.S. Cl.
CPC .......... *B08B 3/04* (2013.01); *H01L 21/02057* (2013.01); *H01L 21/67051* (2013.01); *H01L 21/68735* (2013.01); *B08B 17/025* (2013.01)

(58) Field of Classification Search
CPC ............................................. H01L 21/67051
See application file for complete search history.

(56) References Cited

U.S. PATENT DOCUMENTS

| | | |
|---|---|---|
| 8,109,282 B2 | 2/2012 | Miya et al. |
| 8,696,825 B2 | 4/2014 | Miya et al. |
| 9,431,276 B2 | 8/2016 | Miya et al. |
| 9,601,358 B2 | 3/2017 | Aomatsu et al. |
| 10,096,493 B2 | 10/2018 | Aomatsu et al. |
| 10,115,610 B2 | 10/2018 | Yagi |

(Continued)

FOREIGN PATENT DOCUMENTS

| | | |
|---|---|---|
| JP | 2005072372 | 3/2005 |
| KR | 20080029779 | 4/2008 |

(Continued)

*Primary Examiner* — Spencer E Bell
(74) *Attorney, Agent, or Firm* — JCIPRNET

(57) ABSTRACT

A substrate processing apparatus includes a substrate holding unit having a spin base; a blocking member having a substrate facing surface facing an upper surface of the substrate held by the substrate holding unit and having a diameter larger than the spin base; a blocking member lifting unit raising and lowering the blocking member between a blocking position where a space between the substrate facing surface and the upper surface is blocked from lateral side on the upper surface and a retreat position where the space is not blocked from the lateral side on the upper surface; guards including an inner side and an outer side guards respectively surrounding periphery of the substrate holding unit and surrounding periphery of the inner side guard. An inner circumferential end of the outer side guard is positioned on radial outer side of an inner circumferential end of the inner side guard.

7 Claims, 10 Drawing Sheets

(56) References Cited

U.S. PATENT DOCUMENTS

| | | | |
|---|---|---|---|
| 2012/0175819 A1* | 7/2012 | Miya | B08B 3/10 |
| | | | 264/334 |
| 2015/0234296 A1* | 8/2015 | Yagi | H01L 21/6708 |
| | | | 355/72 |
| 2016/0045938 A1 | 2/2016 | Aomatsu et al. | |
| 2017/0186599 A1 | 6/2017 | Takahashi et al. | |
| 2018/0221925 A1* | 8/2018 | Ito | B08B 3/08 |

FOREIGN PATENT DOCUMENTS

| | | |
|---|---|---|
| KR | 20150097390 | 8/2015 |
| TW | I546881 | 8/2016 |
| TW | I578427 | 4/2017 |
| TW | 201732893 | 9/2017 |

\* cited by examiner

SUBSTRATE PROCESSING APPARATUS AND METHOD OF PROCESSING SUBSTRATE

This application corresponds to and claims the priority benefit of Japanese Patent Application No. 2017-182956 filed with the Japan Patent Office on Sep. 22, 2017, the entire disclosure of which is incorporated herein by reference.

BACKGROUND

Technical Field

This disclosure relates to a substrate processing apparatus and a method of processing a substrate. Examples of the substrate to be processed include, for example, semiconductor wafers, substrates for a liquid crystal display device, substrates for a flat panel display (FPD) such as an organic electroluminescence (organic EL) display device, substrates for an optical disk, substrates for a magnetic disk, substrates for a magneto-optical disk, substrates for a photomask, ceramic substrates, substrates for a solar cell, and the like.

Description of Related Art

In a manufacturing process of a semiconductor device, a single-wafer-processing type substrate processing apparatus which processes substrates one by one may be used to process a surface of a substrate such as semiconductor wafers by processing liquid such as chemical liquid. This single-wafer-processing type substrate processing apparatus includes, for example, a spin chuck which holds and rotates a wafer substantially horizontally, a nozzle which supplies processing liquid to the substrate rotated by the spin chuck, a blocking member disposed at a position facing and close to a surface (upper surface) of the substrate held by the spin chuck, and a processing cup for capturing and draining the processing liquid discharged from the substrate in a chamber.

As illustrated in U.S. Patent Application Publication No. 2016/045938 A1, a processing cup includes a plurality of guards. Each of the guards includes a cylindrical guide portion surrounding a periphery of a spin chuck and a cylindrical inclined portion extending obliquely upward from an upper end of the guide portion toward a central portion. An upper end of each inclined portion constitutes an inner circumferential end of each guard and has a larger diameter than a substrate and a spin base. The inner circumferential ends of the guards are aligned in a radial direction.

Further, in a substrate processing example of a substrate processing apparatus according to U.S. Patent Application Publication No. 2017/186599 A1, chemical liquid processing is performed by discharging chemical liquid from a nozzle disposed between a blocking member and an upper surface of a substrate while the blocking member is disposed at a retreat position that is retreated upward from the surface of the substrate. Similarly, rinsing processing is performed by discharging rinsing liquid from a nozzle disposed between the blocking member and the upper surface of the substrate while the blocking member is disposed at the retreat position.

After the rinsing processing, the blocking member is brought close to the surface of the substrate. In this state, the spin chuck and the blocking member are rotated in a same direction. Thereby, the rinsing liquid that has adhered to the surface of the substrate is shaken off and removed (dried).

In addition, a blocking member according to U.S. Patent Application Publication No. 2015/234296 A1 includes a disc portion disposed above a substrate held by a spin chuck and a cylindrical portion vertically suspended from a circumferential edge of the disc portion so that an upper space above the substrate and a lateral side space of the upper space are more efficiently blocked. That is, the blocking member includes a substrate facing surface facing an upper surface of the substrate held by the spin chuck and an inner circumferential surface facing an outer circumferential end of the substrate held by the spin chuck.

The inventors of the disclosure considered implementing a substrate processing example according to the following Patent Document 2 using a blocking member according to U.S. Patent Application Publication No. 2015/234296 A1.

That is, chemical liquid processing or rinsing processing is performed by discharging processing liquid (chemical liquid or rinse liquid) from a nozzle disposed between the blocking member, having a disc portion and a cylindrical portion, and an upper surface of the substrate while the blocking member is disposed at a retreat position that is retreated upward from the surface of the substrate. At this time, one of a plurality of guards (retreat position guard) is arranged to face a circumferential end surface of the substrate. The chemical liquid discharged from a circumferential edge portion of the substrate is captured by the retreat position guard.

After the rinsing processing, the blocking member is brought close to the surface of the substrate. Further, a guard (blocking position guard) different from the retreat position guard is arranged to face a lower end portion of the cylindrical portion of the blocking member. In this state, the substrate is dried. The processing liquid discharged from the lower end portion of the cylindrical portion of the blocking member is captured by the blocking position guard.

In this case, there is the following problem. That is, since the blocking member according to U.S. Patent Application Publication No. 2015/234296 A1 has the cylindrical portion defining an inner circumferential surface, the blocking member is provided to have a larger diameter than a spin base. When using such a blocking member with a large diameter, it is necessary to enlarge an inner diameter of each guard to avoid interference with an inner circumferential end of the guard.

However, when the inner diameter of the retreat position guard is enlarged, in the liquid chemical processing or the rinsing processing, a distance between the circumferential edge portion of the substrate and the retreat position guard becomes long, and thus it is conceivable that the processing liquid (chemical liquid or rinsing liquid) scattering from the circumferential edge of the substrate may not be able to be efficiently captured by a desired retreat position guard. That is, a liquid splattering prevention performance of the retreat position guard deteriorates. In addition, since a scattering direction of the processing liquid from the lower end portion of the cylindrical portion of the blocking member forms a wide angle, in a processing (for example, a drying processing) performed in a state in which the blocking member is disposed at the blocking position, when an inner diameter of the retreat position guard is enlarged, there is a likelihood that the processing liquid scattering from the lower end portion of the cylindrical portion of the blocking member will be captured by a retreat position guard which was not originally intended. In this case, there is a likelihood of accidental mixing occurring in the retreat position guard.

That is, it is desired to efficiently capture the processing liquid discharged from the circumferential edge portion of the substrate with a desired guard while avoiding interference between the blocking member and the guard.

The disclosure is to provide a substrate processing apparatus and a method of processing a substrate capable of efficiently capturing a processing liquid discharged from the circumferential edge portion of the substrate with a desired guard while avoiding interference between the blocking member and the guard.

SUMMARY

The disclosure provides a substrate processing apparatus which applies processing with a processing liquid to a substrate. The substrate processing apparatus includes a substrate holding unit having a spin base to hold the substrate, a blocking member having a substrate facing surface which faces an upper surface of the substrate held by the substrate holding unit and having a diameter larger than the spin base; a blocking member lifting unit, raising and lowering the blocking member between a blocking position and a retreat position that is retreated upward from the blocking position, wherein at the blocking position a space between the substrate facing surface and the upper surface is blocked from a lateral side on the upper surface and at the retreat position the space is not blocked from the lateral side on the upper surface; and a plurality of guards including an inner side guard surrounding a periphery of the substrate holding unit and an outer side guard surrounding a periphery of the inner side guard to capture a processing liquid discharged from between the substrate and the blocking member, where the inner side guard and the outer side guard are cylindrical. An inner circumferential end of the outer side guard is positioned on a radial outer side of an inner circumferential end of the inner side guard.

BRIEF DESCRIPTION OF THE DRAWINGS

The foregoing and other objectives, features, and advantages of the disclosure will become apparent from the following description of the embodiments with reference to the accompanying drawings.

DESCRIPTION OF THE EMBODIMENTS

Figure 1:
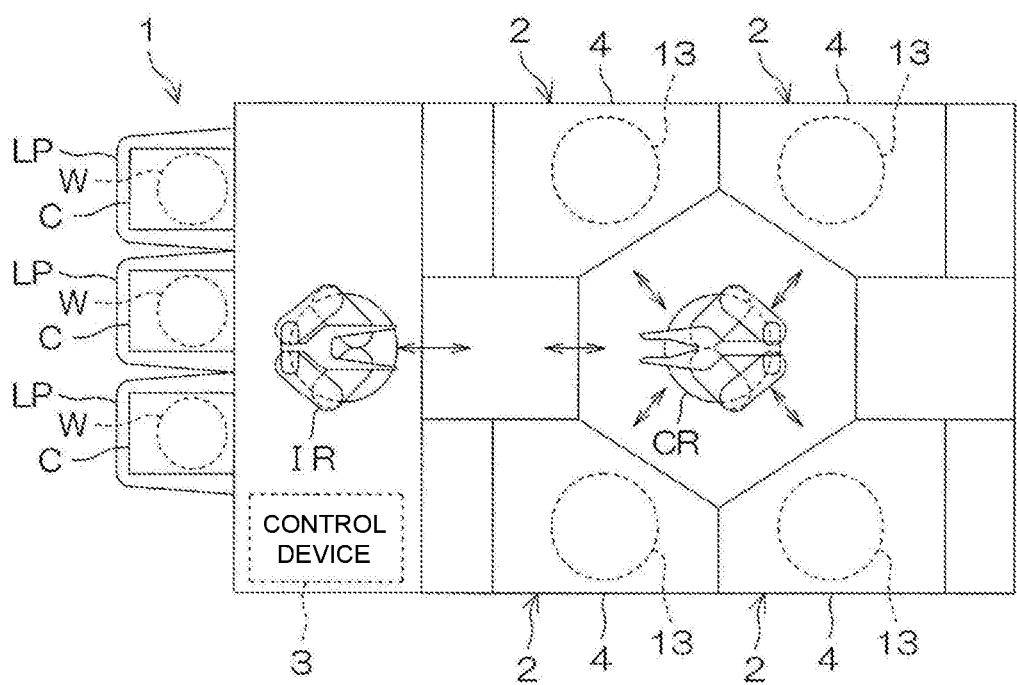
FIG. 1 is a schematic view of a substrate processing apparatus according to one embodiment of the disclosure when viewed from above.

FIG. 1 is a schematic view of a substrate processing apparatus 1 according to one embodiment of the disclosure when viewed from above.

The substrate processing apparatus 1 is a single-wafer-processing type apparatus that processes substrates W such as silicon wafers one by one. In this embodiment, the substrates W are disc-shaped substrates. The substrate processing apparatus 1 includes a plurality of processing units 2 that process the substrates W with processing liquid and rinsing liquid, load ports LP on which substrate containers for accommodating a plurality of substrates W processed by the processing units 2 are respectively placed, an indexer robot IR and a substrate conveying robot CR which convey the substrates W between the load ports LP and the processing units 2, and a control device 3 that controls the substrate processing apparatus 1. The indexer robot IR conveys the substrates W between the substrate containers and the substrate conveying robot CR. The substrate conveying robot CR conveys the substrates W between the indexer robot IR and the processing units 2. The plurality of processing units 2, for example, have the same configuration.

Figure 2:
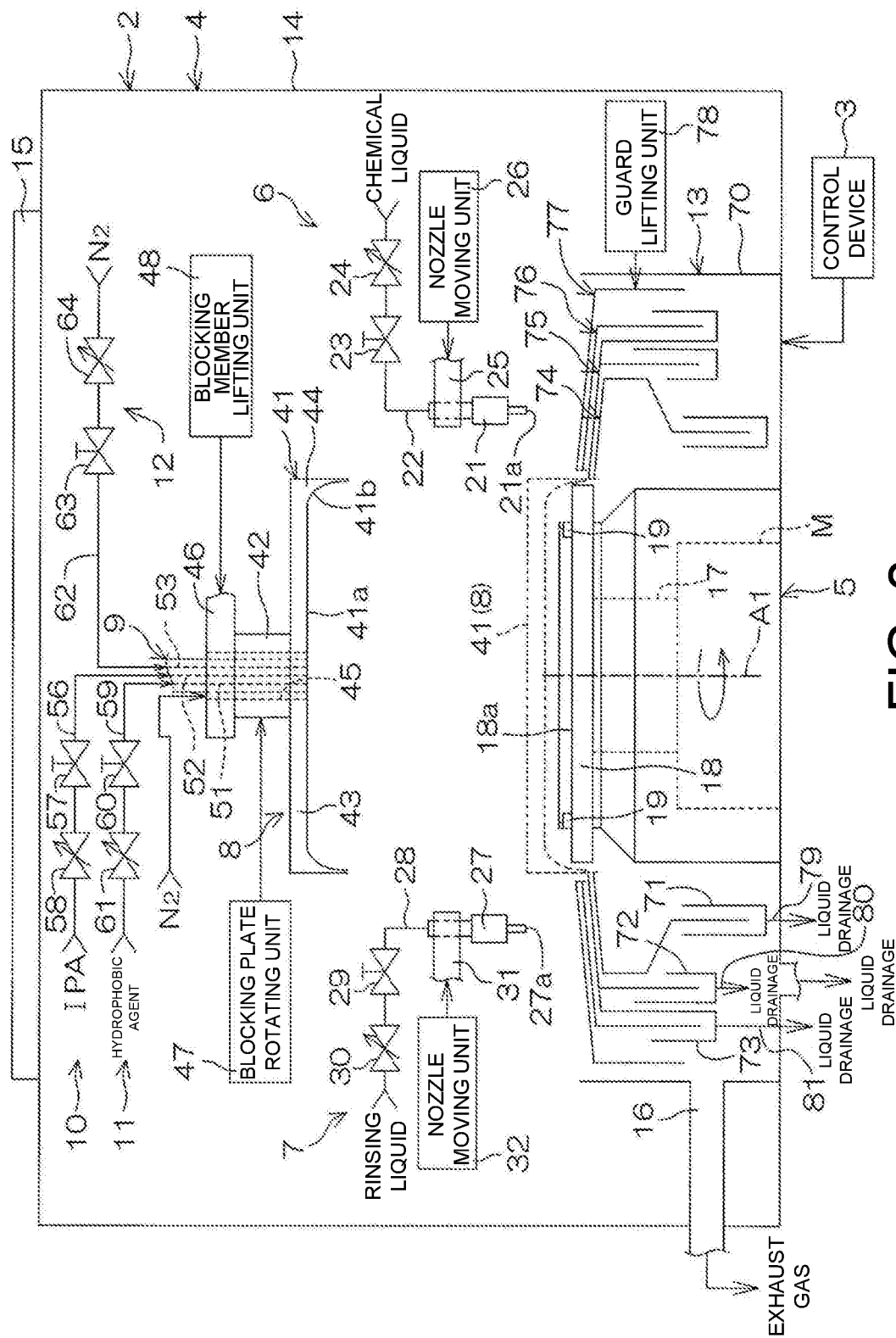
FIG. 2 is a schematic cross-sectional view for describing a configuration example of a processing unit provided in the substrate processing apparatus.
Figure 3:
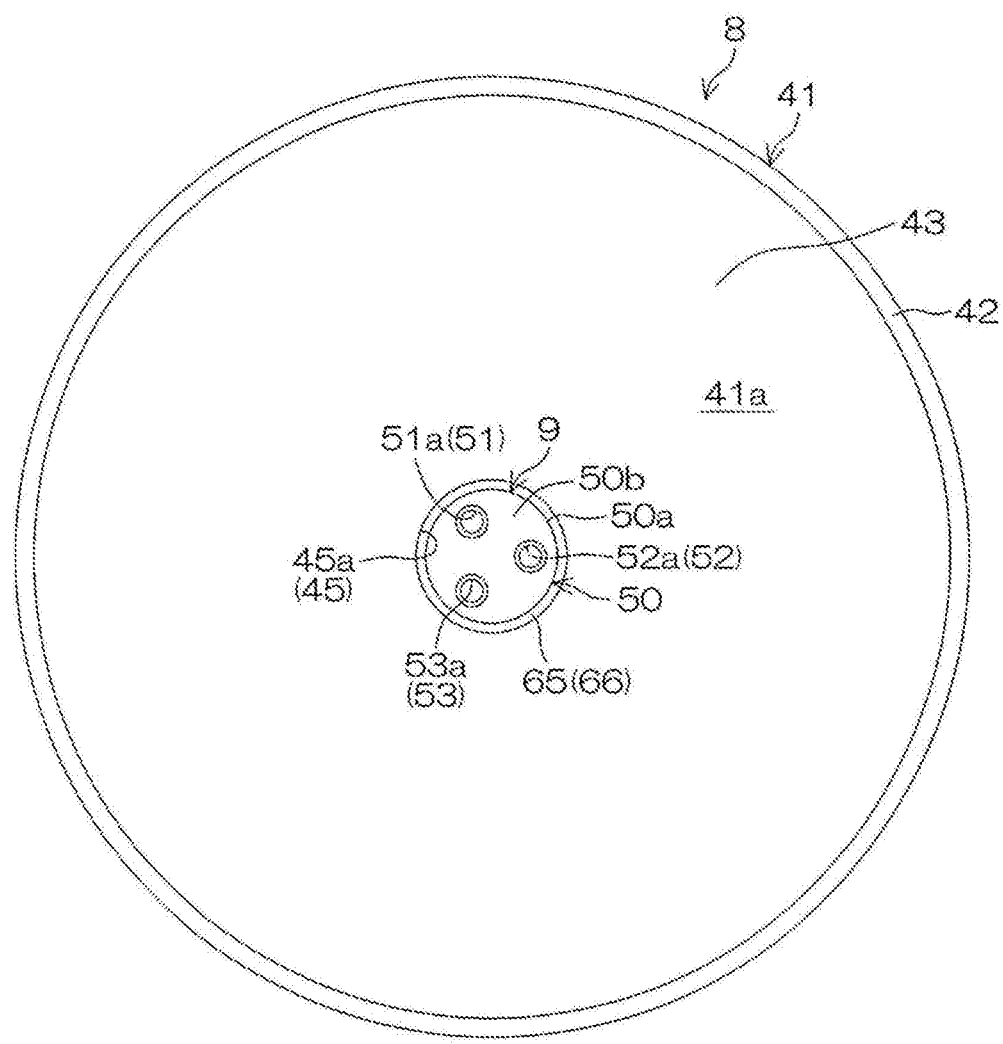
FIG. 3 is a bottom view of a blocking member provided in the processing unit.
Figure 4:
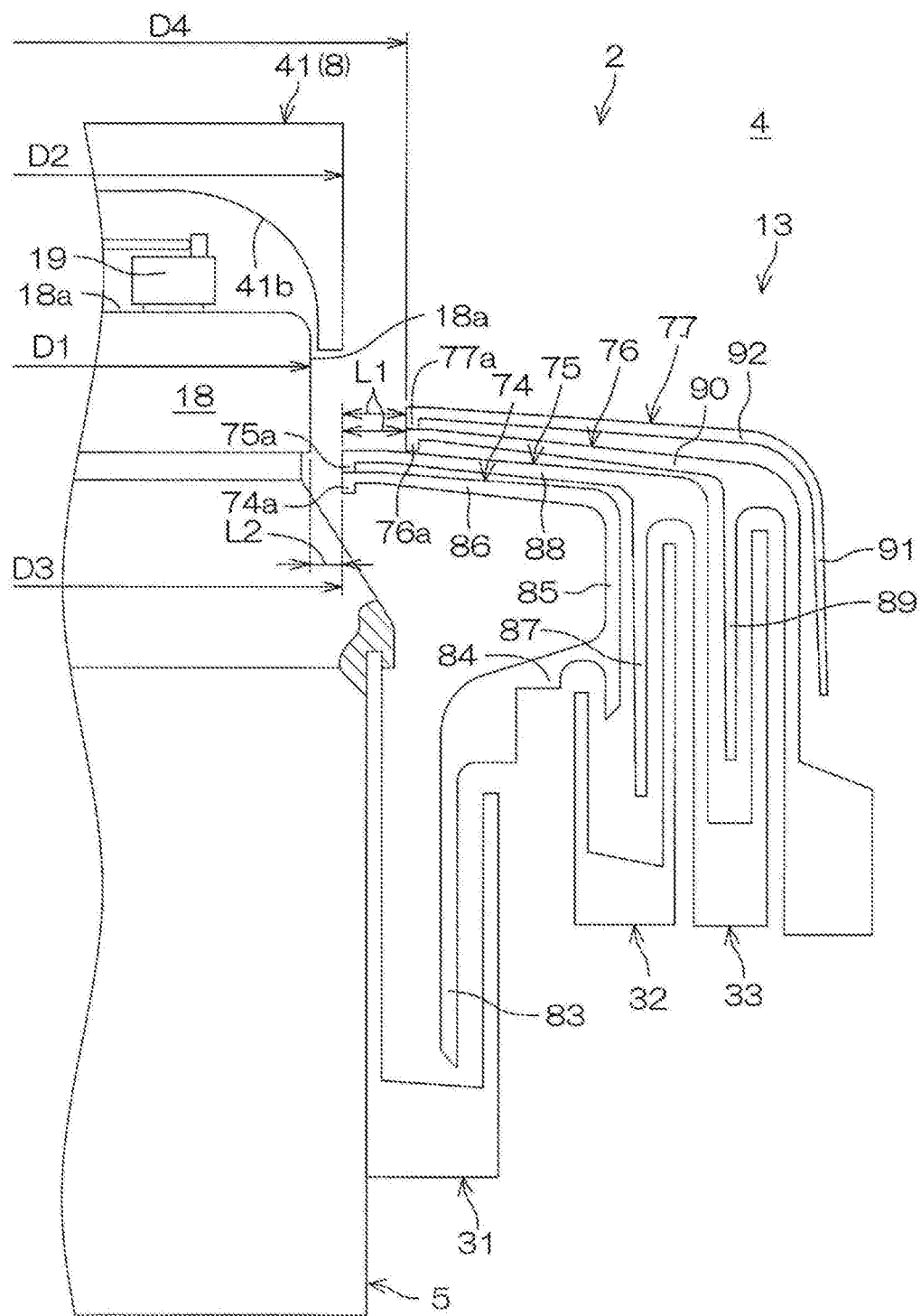
FIG. 4 is a cross-sectional view of a processing cup provided in the processing unit.

FIG. 2 is a schematic cross-sectional view for describing a configuration example of the processing unit 2. FIG. 3 is a bottom view of a blocking member 8. FIG. 4 is a cross-sectional view of a processing cup 13.

As illustrated in FIG. 2, each of the processing units 2 includes a box-shaped chamber 4, a spin chuck (substrate holding unit) 5 that holds a single substrate W in a horizontal posture in the chamber 4 and rotates the substrate W about a vertical rotation axis A1 that passes through a center of the substrate W, a chemical liquid supply unit (first processing liquid unit) 6 for supplying chemical liquid (first processing liquid) to an upper surface of the substrate, a rinsing liquid supply unit (first processing liquid unit) 7 for supplying rinsing liquid (first processing liquid) to the upper surface of the substrate W held by the spin chuck 5, a blocking member 8 that faces the upper surface of the substrate W held by the spin chuck 5, a central axis nozzle 9 which is vertically inserted through an interior of the blocking member 8 and discharges processing liquid toward a central portion of the upper surface of the substrate W held by the spin chuck 5, an organic solvent supply unit (second processing liquid unit) 10 for supplying an organic solvent (second processing liquid) which is used as low surface tension liquid having a specific gravity higher than air and a surface tension lower than water to the central axis nozzle 9, a hydrophobic agent supply unit (second processing liquid unit) 11 for supplying a liquid hydrophobic agent (second processing liquid) to the central axis nozzle 9, an inert gas supply unit 12 for supplying an inert gas to the central axis nozzle 9, and the cylindrical processing cup 13 surrounding the spin chuck 5.

As illustrated in FIG. 2, the chamber 4 includes a box-shaped partition wall 14 that accommodates the spin chuck 5, a fan filter unit (FFU) 15 serving as a blowing unit that sends clean air (air filtered by filters) from an upper portion of the partition wall 14 to the inside of the partition wall 14, and an exhaust duct 16 that exhausts gas in the chamber 4 from a lower portion of the partition wall 14. The FFU 15 is disposed above the partition wall 14 and is attached to a ceiling of the partition wall 14. The FFU 15 sends clean air downward into the chamber 4 from the ceiling of the partition wall 14. The exhaust duct 16 is connected to a bottom portion of the processing cup 13 and guides a gas in the chamber 4 toward an exhaust gas treatment facility provided in a factory where the substrate processing apparatus 1 is set up. Therefore, a downflow (downward flow) that flows downward in the chamber 4 is formed by the FFU 15 and the exhaust duct 16. Processing of the substrate W is performed in a state that the downflow is formed in the chamber 4.

As illustrated in FIG. 2, a clamping-type chuck for horizontally holding the substrate W while sandwiching the substrate W in a horizontal direction is employed as the spin chuck 5. Specifically, the spin chuck 5 includes a spin motor M, a spin shaft 17 integrated with a drive shaft of the spin motor M, and a disc-shaped spin base 18 mounted substantially horizontally on an upper end of the spin shaft 17. A diameter of the spin base 18 is equal to or larger than a diameter of the substrate W.

As illustrated in FIG. 2, a plurality (three or more, for example four) of clamping pins 19 are disposed at a circumferential edge portion of an upper surface 18a of the spin base 18. The plurality of clamping pins 19 are disposed at appropriate intervals (for example, at equal intervals) on a circumference corresponding to an outer circumferential shape of the substrate W at an outer circumferential portion of the upper surface 18a of the spin base 18.

The chemical liquid supply unit 6 includes a chemical liquid nozzle 21, a chemical liquid pipe 22 connected to the chemical liquid nozzle 21 and through which the chemical liquid is supplied from a chemical liquid supply source, and a chemical liquid valve 23 and a first flow rate regulating valve 24 that are incorporated into the liquid chemical pipe 22. The chemical liquid nozzle 21 is a straight nozzle that discharges liquid, for example, in a continuous flow state from a chemical liquid discharge port 21a (first processing liquid discharge port). For example, the chemical liquid discharge port 21a is formed at a lower end of a body of the chemical liquid nozzle 21 and the chemical liquid is discharged downward from the chemical liquid discharge port 21a. The first flow rate regulating valve 24 includes a valve body having a valve seat provided therein, a valve element that opens and closes the valve seat, and an actuator that moves the valve element between an open position and a closed position. Other flow rate regulating valves have the same configuration.

When the chemical liquid valve 23 is open, the chemical liquid is discharged downward from the chemical liquid discharge port 21a. When the chemical liquid valve 23 is closed, the discharge of the chemical liquid from the chemical liquid discharge port 21a is stopped. A discharge flow rate of the chemical liquid from the liquid chemical discharge port 21a is regulated by the first flow rate regulating valve 24. The chemical liquid may be, for example, liquid containing at least one of sulfuric acid, acetic acid, nitric acid, hydrochloric acid, hydrofluoric acid, ammonia water, hydrogen peroxide water, an organic acid (for example, citric acid, oxalic acid, or the like), an organic alkali (for example, tetramethylammonium hydroxide (TMAH) or the like), a surfactant, and a corrosion inhibitor.

The chemical liquid supply unit 6 further includes a nozzle arm 25 having a distal end portion to which the chemical liquid nozzle 21 is attached, and a first nozzle moving unit 26 that moves the chemical liquid nozzle 21, for example, by swinging the nozzle arm 25 around a predetermined swing axis. The first nozzle moving unit 26 includes a motor and the like. The first nozzle moving unit 26 moves the chemical liquid nozzle 21 between a processing position at which the chemical liquid discharged from the chemical liquid nozzle 21 is supplied to the upper surface of the substrate W and a retreat position at which the chemical liquid nozzle 21 is retreated to a side of the spin chuck 5 in a plan view.

The rinsing liquid supply unit 7 includes a rinsing liquid nozzle 27, a rinsing liquid pipe 28 connected to the rinsing liquid nozzle 27 and through which rinsing liquid from a rinsing liquid supply source is supplied, and a rinsing liquid valve 29 and a second flow rate regulating valve 30 that are incorporated in the rinsing liquid pipe 28. The rinsing liquid nozzle 27 is a straight nozzle that discharges liquid, for example, in a continuous flow state from a rinsing liquid discharge port 27a (first processing liquid discharge port). For example, the rinsing liquid discharge port 27a is formed at a lower end of a body of the rinsing liquid nozzle 27 and the rinsing liquid is discharged downward from the rinsing liquid discharge port 27a.

When the rinsing liquid valve 29 is open, the rinsing liquid is discharged downward from the rinsing liquid discharge port 27a. When the rinsing liquid valve 29 is closed, the discharge of the rinsing liquid from the rinsing liquid discharge port 27a is stopped. A discharge flow rate of the rinsing liquid from the rinsing liquid discharge port 27a is regulated by the second flow rate regulating valve 30. The rinsing liquid is water. In this embodiment, the water is any one of pure water (deionized water), carbonated water, electrolyzed ionic water, hydrogen water, ozone water, and ammonia water at a diluted concentration (for example, about 10 to 100 ppm).

The rinsing liquid supply unit 7 further includes a nozzle arm 31 having a distal end portion to which the rinsing liquid nozzle 27 is attached, and a second nozzle moving unit 32 that moves the rinsing liquid nozzle 27, for example, by swinging the nozzle arm 31 around a predetermined swing axis. The second nozzle moving unit 32 includes a motor and the like. The second nozzle moving unit 32 moves the rinsing liquid nozzle 27 between a processing position at which the rinsing liquid discharged from the rinsing liquid nozzle 27 is supplied to the upper surface of the substrate W and a retreat position at which the rinsing liquid nozzle 27 is retreated to a side of the spin chuck 5 in a plan view.

The blocking member 8 includes a blocking plate 41 and an upper spin shaft 42 provided to be rotatable integrally with the blocking plate 41. The blocking plate 41 is formed in a disc shape which is larger than the diameter of the substrate W. The blocking plate 41 includes a disc portion 43 that is held in a horizontal posture and a cylindrical portion 44 that extends downward from an outer circumferential portion of the disc portion 43. The disc portion 43 is coaxial with the cylindrical portion 44. The disc portion 43 is disposed above a lower end of the cylindrical portion 44. A cylindrical through hole 45 penetrating vertically through the blocking plate 41 and the upper spin shaft 42 is formed in a central portion of the disc portion 43. An inner circumferential wall of the through hole 45 is defined by a cylindrical surface. The central axis nozzle 9 is inserted vertically into the through hole 45.

The blocking plate 41 includes a cup-shaped inner surface recessed downward. The inner surface of the blocking plate 41 includes a substrate facing surface 41a facing above the upper surface of the substrate W and an inner circumferential surface 41b facing an outer circumferential end of the substrate W and an outer circumferential surface (outer circumferential end) 18b of the spin base 18 in a state in which the blocking member 8 is at a blocking position. A lower surface of the disc portion 43 corresponds to the substrate facing surface 41a. The substrate facing surface 41a is a flat surface parallel to the upper surface of the substrate W.

An inner circumferential surface of the cylindrical portion 44 corresponds to the inner circumferential surface 41b. The inner circumferential surface 41b includes an annular inner inclined portion extending outward and obliquely downward from the substrate facing surface 41a. The inner inclined portion has an arcuate cross section in which an inclination angle with respect to the rotation axis A1 changes continuously. The cross section of the inner inclined portion is open downward. An inner diameter of the inner circumferential surface 41b increases toward a lower end of the inner circumferential surface 41b. The lower end of the inner circumferential surface 41b has an inner diameter larger than an outer diameter of the spin base 18.

The central axis nozzle 9 extends in a vertical direction along a vertical axis passing through the center of the blocking plate 41 and the substrate W, that is, along the rotation axis A1. The central axis nozzle 9 is raised and lowered together with the blocking plate 41.

The central axis nozzle 9 extends in a vertical direction along the vertical axis passing through the center of the blocking plate 41 and the substrate W, that is, along the rotation axis A1. The central axis nozzle 9 is disposed above the spin chuck 5 and passes through an internal space of the blocking plate 41 and the upper spin shaft 42. The central axis nozzle 9 is raised and lowered together with the blocking plate 41 and the upper spin shaft 42.

The upper spin shaft 42 is supported to be relatively rotatable by a support arm 46 extending horizontally above the blocking plate 41. A blocking plate rotating unit 47 having a configuration in which an electric motor and the like is included is coupled to the blocking plate 41 and the upper spin shaft 42. The blocking plate rotating unit 47 rotates the blocking plate 41 and the upper spin shaft 42 around the rotation axis A1 with respect to the support arm 46.

Further, a blocking member lifting unit 48 having a configuration in which an electric motor, a ball screw, and the like are included is coupled to the support arm 46. The blocking member lifting unit 48 raises and lowers the blocking member 8 (blocking plate 41 and the upper spin shaft 42) and the central axis nozzle 9 in a vertical direction together with the support arm 46.

The blocking member lifting unit 48 raises and lowers the blocking plate 41 between a lower blocking position (illustrated by a broken line in FIG. 2, blocking position) and a retreat position (illustrated by a solid line in FIG. 2). At the lower blocking position, the substrate facing surface 41a is close to the upper surface of the substrate W held by the spin chuck 5 and a height of the lower end of the cylindrical portion 44 is positioned below a height of the substrate W, and at the retreat position (illustrated by a solid line in FIG. 2), substrate facing surface 41a has retreated further upward than the lower blocking position.

The blocking member lifting unit 48 can hold the blocking plate 41 at an upper blocking position (position of the blocking plate 41 illustrated in FIGS. 8C and 8D, blocking position), the lower blocking position, and the retreat position. The lower blocking position is a position at which the substrate facing surface 41a forms a blocking space between the substrate facing surface 41a and the upper surface of the substrate W. This blocking space is not completely isolated from a surrounding space thereof, but is substantially isolated from the surrounding space. The upper blocking position is a position slightly above (a few millimeters above) the lower blocking position. Even when the blocking plate 41 is disposed at the upper blocking position, the blocking space is formed between the substrate facing surface 41a and the upper surface of the substrate W.

The central axis nozzle 9 includes a columnar casing 50 extending vertically inside the through hole 45, a first nozzle pipe 51, a second nozzle pipe 52, and a third nozzle pipe 53 which are vertically inserted inside the casing 50. The casing 50 includes a cylindrical outer circumferential surface 50a and a substrate facing surface 50b provided at a lower end portion of the casing 50 and configured to face the central portion of the upper surface of the substrate W. Each of the first to the third nozzle pipes 51 to 53 is an inner tube.

As illustrated in FIG. 2, the first nozzle pipe 51 includes a vertical portion extending in a vertical direction. As illustrated in FIG. 3, a lower end of the first nozzle pipe 51 is open to the substrate facing surface 50b of the casing 50 to form a first discharge port (first processing liquid discharge port) 51a. A liquid organic solvent from the organic solvent supply unit 10 is supplied to the first nozzle pipe 51. The organic solvent supply unit 10 includes an organic solvent pipe 56 connected to an upstream end side of the first nozzle pipe 51, an organic solvent valve 57 incorporated in a middle portion of the organic solvent pipe 56, and a third flow rate regulating valve 58 that regulates an opening degree of the organic solvent pipe 56. When the organic solvent valve 57 is opened, the liquid organic solvent is discharged downward from the first discharge port 51a. When the organic solvent valve 57 is closed, the discharge of the liquid organic solvent from the first discharge port 51a is stopped. The discharge flow rate of the liquid organic solvent from the first discharge port 51a is regulated by the third flow rate regulating valve 58.

In this embodiment, the organic solvent is, for example, isopropyl alcohol (IPA), but, for example, methanol, ethanol, acetone, ethylene glycol (EG), and hydrofluoroether (HFE) can be exemplified as such an organic solvent in addition to IPA. Further, as the organic solvent, not only a case in which it is formed of a single component but also a liquid mixed with other components may be used. For example, it may be a mixed liquid of IPA and acetone, or a mixed liquid of IPA and methanol.

As illustrated in FIG. 2, the second nozzle pipe 52 includes a vertical portion extending in a vertical direction. As illustrated in FIG. 3, a lower end of the second nozzle pipe 52 is open to the substrate facing surface 50b of the casing 50 to form a second discharge port (second processing liquid discharge port) 52a. A liquid hydrophobic agent (SMT) from the hydrophobic agent supply unit 11 is supplied to the second nozzle pipe 52. The hydrophobic agent supply unit 11 includes a hydrophobic agent pipe 59 connected to an upstream end side of the second nozzle pipe 52, a hydrophobic agent valve 60 incorporated in a middle portion of the hydrophobic agent pipe 59, and a fourth flow rate regulating valve 61 that regulates an opening degree of the hydrophobic agent pipe 59. When the hydrophobic agent valve 60 is opened, a liquid hydrophobic agent is discharged downward from the second discharge port 52a. When the hydrophobic agent valve 60 is closed, the discharge of the liquid hydrophobic agent from the second discharge port 52a is stopped. The discharge flow rate of the liquid hydrophobic agent from the second discharge port 52a is regulated by the fourth flow rate regulating valve 61. The hydrophobic agent may be a silicon-based hydrophobic agent or a metal-based hydrophobic agent.

The silicon based hydrophobic agent is a hydrophobic agent that renders a compound containing silicon and silicon (Si) itself hydrophobic. The silicon based hydrophobic agent is, for example, a silane coupling agent. The silane coupling agent includes, for example, at least one of hexamethyldisilazane (HMDS), tetramethylsilane (TMS), a fluorine-based alkylchlorosilane, an alkyldisilazane, and a non-chlorinated hydrophobic agent. Non-chlorinated hydrophobic agents may include, for example, at least one of dimethylsilyldimethylamine, dimethylsilyldiethylamine, hexamethyldisilazane, tetramethyldisilazane, bis(dimethylamino)dimethylsilane, N, N-dimethylaminotrimethylsilane, N-(trimethylsilyl)dimethylamine, and organosilane compounds.

The metal based hydrophobic agent has, for example, a strongly coordinating property, and is a solvent which renders a metal hydrophobic mainly by coordinate bonding. The hydrophobic agent includes, for example, at least one of an amine having a hydrophobic group and an organic silicon compound.

As illustrated in FIG. 3, the third nozzle pipe 53 includes a vertical portion extending in a vertical direction. A lower end of the third nozzle pipe 53 is open to the substrate facing surface 50b of the casing 50 to form a third discharge port 53a. A hydrophobic agent from the inert gas supply unit 12 is supplied to the third nozzle pipe 53. The inert gas supply unit 12 includes an inert gas pipe 62 connected to an upstream end side of the third nozzle pipe 53, an inert gas valve 63 incorporated in a middle portion of the inert gas pipe 62, and a fifth flow rate regulating valve 64 that regulates an opening degree of the inert gas pipe 62. When the inert gas valve 63 is opened, an inert gas is discharged downward from the third discharge port 53a. When the inert gas valve 63 is closed, the discharge of the inert gas from the third discharge port 53a is stopped. The discharge flow rate of the inert gas from the third discharge port 53a is regulated by the fifth flow rate regulating valve 64. The inert gas is not limited to nitrogen gas, and other inert gases such as helium gas or argon gas may be used. Further, the inert gas may be nitrogen gas or a mixed gas of nitrogen gas and a gas other than nitrogen gas.

Further, a cylindrical gap 65 (see FIG. 3) is formed by a cylindrical outer circumferential wall (the outer circumferential surface 50a of the casing 50) of the central axis nozzle 9 and a cylindrical inner circumferential surface 45a of the through hole 45. The cylindrical gap 65 functions as a flow path through which an inert gas flows. A lower end of the cylindrical gap 65 is open in an annular shape surrounding the central axis nozzle 9 and forms a peripheral central gas discharge port 66 (see FIG. 3).

As illustrated in FIGS. 2 and 4, the processing cup 13 is disposed on an outer side (in a direction away from the rotation axis A1) of the substrate W held by the spin chuck 5.

Hereinafter, a structure of the processing cup 13 will be described mainly with reference to FIG. 4.

The processing cup 13 includes a cylindrical member 70, a plurality of cups 71 to 73 (first to third cups 71 to 73) surrounding a periphery of the spin base 18 on an inner side of the cylindrical member 70, a plurality of guards 74 to 77 (a first guard 74, a second guard 75, a third guard 76, and a fourth guard 77) that receive processing liquids (chemical liquid, rinsing liquid, an organic solvent, a hydrophobic agent, or the like) scattered around the substrate W, and a guard lifting unit 78 that raises and lowers the plurality of guards 74 to 77 individually. The processing cup 13 is disposed on an outer side (direction away from the rotation axis A1) of an outer circumference of the substrate W held by the spin chuck 5.

Each of the cups 71 to 73 is cylindrical (annular) and surrounds a periphery of the spin chuck 5. The second cup 72 which is the second cup in order from the inside is disposed on an outer side of the first cup 71, and the outermost third cup 73 is disposed on an outer side of the second cup 72. The third cup 73 is integrated with the second guard 75, for example, and is raised and lowered together with the second guard 75. Each of the cups 71 to 73 forms an annular groove that is upwardly opened.

A first drain pipe 79 is connected to the groove of the first cup 71. A processing liquid (mainly a rinsing liquid) guided to the groove of the first cup 71 is sent to a drainage treatment facility outside the apparatus through the first drain pipe 79, and a drainage treatment is performed in the drainage treatment facility.

A second drain pipe 80 is connected to the groove of the second cup 72. A processing liquid (mainly a liquid chemical) guided to the groove of the second cup 72 is sent to the drainage treatment facility outside the apparatus through the second drain pipe 80, and a drainage treatment is performed in the drainage treatment facility.

A third drain pipe 81 is connected to the groove of the third cup 73. A processing liquid (mainly a hydrophobic agent) guided to the groove of the third cup 73 is sent to a recovery facility outside the apparatus through the third drain pipe 81, and a recovery treatment is performed in the recovery facility.

The innermost first guard 74 surrounds the periphery of the spin chuck 5 and has a shape substantially rotationally symmetrical with respect to the rotation axis A1 of the substrate W held by the spin chuck 5. The first guard 74 includes a cylindrical lower end portion 83 surrounding the periphery of the spin chuck 5, a cylindrical portion 84 extending outward (in a direction away from the rotation axis A1 of the substrate W) from an upper end of the lower end portion 83, a cylindrical middle stage portion 85 extending vertically upward from an outer circumferential portion of an upper surface of the cylindrical portion 84, and an annular first inclined portion 86 extending obliquely upward from an upper end of the middle stage portion 85 toward an inner side (in a direction of coming closer to the rotation axis A1 of the substrate W). The lower end portion 83 is positioned on the groove of the first cup 71 and is accommodated in the groove of the first cup 71 in a state in which the first guard 74 and the first cup 71 are closest to each other. An inner circumferential end 74a of the first guard 74 (a distal end of the first inclined portion 86) is a circular shape having a larger diameter than the substrate W held by the spin chuck 5 in a plan view. Further, as illustrated in FIG. 2 or the like, a cross-sectional shape of the first inclined portion 86 is linear.

The second guard 75 which is the second guard in order from the inside surrounds the periphery of the spin chuck 5 on an outer side of the first guard 74 and has a shape substantially rotationally symmetrical with respect to the rotation axis A1 of the substrate W held by the spin chuck 5. The second guard 75 includes a cylindrical portion 87 coaxial with the first guard 74, and a second inclined portion 88 extending obliquely upward from an upper end of the cylindrical portion 87 toward a central portion (in a direction of coming closer to the rotation axis A1 of the substrate W). An inner circumferential end 75a of the second guard 75 (a distal end of the second inclined portion 88) is a circular shape having a larger diameter than the substrate W held by the spin chuck 5 in a plan view. Further, as illustrated in FIG. 4, a cross-sectional shape of the second inclined portion 88 is linear.

The cylindrical portion 87 is positioned on the groove of the second cup 72. Further, the second inclined portion 88 is provided above the first inclined portion 86 of the first guard 74 such that these overlap each other so that the second inclined portion 88 is close to the first inclined portion 86 with a minute gap maintained therebetween in a state in which the first guard 74 and the second guard 75 are closest to each other.

The third guard 76 which is the third guard in order from the inside surrounds the periphery of the spin chuck 5 on an outer side of the second guard 75 and has a shape substantially rotationally symmetrical with respect to the rotation axis A1 of the substrate W held by the spin chuck 5. The third guard 76 includes a cylindrical portion 89 coaxial with the second guard 75, and a third inclined portion 90 extending obliquely upward from an upper end of the cylindrical portion 89 toward a central portion (in a direction of coming closer to the rotation axis A1 of the substrate W). An inner circumferential end 76a of the third guard 76 (a distal end of the third inclined portion 90) is a circular shape having a larger diameter than the substrate W held by the spin chuck 5 in a plan view. As illustrated in FIG. 4, a cross-sectional shape of the third inclined portion 90 is linear.

The cylindrical portion 89 is positioned on the groove of the third cup 73. Further, the third inclined portion 90 is provided above the second inclined portion 88 of the second guard 75 such that these overlap each other so that the third inclined portion 90 is close to the second inclined portion 88 with a minute gap maintained therebetween in a state in which the second guard 75 and the third guard 76 are closest to each other.

The outermost fourth guard 77 surrounds the periphery of the spin chuck 5 on an outer side of the third guard 76 and has a shape substantially rotationally symmetrical with respect to the rotation axis A1 of the substrate W held by the spin chuck 5. The fourth guard 77 includes a cylindrical portion 91 coaxial with the third guard 76, and a fourth inclined portion 92 extending obliquely upward from an upper end of the cylindrical portion 91 toward a central portion (in a direction of coming closer to the rotation axis A1 of the substrate W). An inner circumferential end 77a of the fourth guard 77 (a distal end of the fourth inclined portion 92) is a circular shape having a larger diameter than the substrate W held by the spin chuck 5 in a plan view. As illustrated in FIG. 4, a cross-sectional shape of the fourth inclined portion 92 is linear.

A folded portion bent downward is formed at a distal end of each of the inclined portions 86, 88, 90, and 92 (respective inner circumferential ends 74a to 77a of the guards 74 to 77).

That is, the processing cup 13 is foldable, and expanding and folding of the processing cup 13 is performed when the guard lifting unit 78 raises and lowers at least one of the four guards 74 to 77.

The processing cup 13 can be raised and lowered between an upper position (distal ends of the inclined portions 86, 88, 90, and 92 are positioned above the upper surface of the substrate W) and a lower position (distal ends of the inclined portions 86, 88, 90, and 92 are positioned below the upper surface of the substrate W) by driving of the guard lifting unit 78.

Supply of the processing liquid (chemical liquid, rinsing liquid, an organic solvent, a hydrophobic agent, and the like) to the substrate W and drying of the substrate W are performed in a state in which any one of the guards 74 to 77 faces the circumferential end surface of the substrate W.

In order to realize a state in which the first guard 74 faces the circumferential end surface of the substrate W (a state illustrated in FIG. 8A, hereinafter referred to as "a first guard facing state" in some cases), all the four guards 74 to 77 are disposed at the upper position. In the first guard facing state, all the processing liquid discharged from a circumferential edge portion of the substrate W in a rotating state is received by the first guard 74. In a substrate processing example performed by the processing unit 2, in a chemical liquid step S3 (a first processing step, see FIG. 7) to be described below, processing is performed in a state in which the processing cup 13 faces the first guard.

Further, in order to realize a state in which the second guard 75 faces the circumferential end surface of the substrate W (hereinafter referred to as "a second guard facing state" in some cases), the first guard 74 is disposed at the lower position and the remaining three guards 75 to 77 are disposed at the upper position. In the second guard facing state, all the processing liquid discharged from the circumferential edge portion of the substrate W in a rotating state is received by the second guard 75. In the substrate processing example performed by the processing unit 2, in a rinsing step S4 (see FIG. 7) to be described below, processing is performed in a state in which the processing cup 13 faces the second guard.

Further, in order to realize a state in which the third guard 76 faces the circumferential end surface of the substrate W (hereinafter referred to as "a third guard facing state" in some cases), the first and the second guards 74 and 75 are disposed at the lower position and the remaining two guards 76 and 77 are disposed at the upper position. In the third guard facing state, all the processing liquid discharged from the circumferential edge portion of the substrate W in a rotating state is received by the third guard 76. In the substrate processing example performed by the processing unit 2, in the rinsing step S4 (see FIG. 7) to be described below, processing is performed in a state in which the processing cup 13 faces the third guard.

Further, in order to realize a state in which the fourth guard 77 faces the circumferential end surface of the substrate W (hereinafter referred to as "a fourth guard facing state" in some cases), the first to third guards 74 to 76 are disposed at the lower position and the remaining guard 77 is disposed at the upper position. In the fourth guard facing state, all the processing liquid discharged from the circumferential edge portion of the substrate W in a rotating state are received by the fourth guard 77. In the substrate processing example performed by the processing unit 2, in the rinsing step S4 (see FIG. 7) to be described below, processing is performed in a state in which the processing cup 13 faces the fourth guard.

As illustrated in FIG. 4, in this embodiment, an outer diameter D2 of the blocking member 8 (the blocking plate 41) is larger than an outer diameter D1 of the spin base 18 (D 2>D 1).

Further, the inner circumferential ends 76a and 77a of the third and the fourth guards 76 and 77 are positioned in a radial direction on a outer side of the inner circumferential ends 74a and 75a of the first and the second guards 74 and 75. That is, a diameter D4 of a circumference defined by the inner circumferential ends 76a and 77a of the third and the fourth guards 76 and 77 is larger than a diameter D3 of a circumference defined by the inner circumferential ends 74a and 75a of the first and the second guards 74 and 75 (D4>D3). A distance L1 between the diameter D4 and the diameter D3 is, for example, 5 mm.

Further, in this embodiment, the diameter D3 of the circumference defined by the inner circumferential ends 74a and 75a of the first and the second guards 74 and 75 is substantially equal to the outer diameter D2 of the blocking member 8 (D3 D2).

Further, positions in a radial direction of the inner circumferential ends 74a and 75a of the first and the second guards 74 and 75 are provided such that a distance L2 in a radial direction between the circumferential edge portion of the substrate W and the first and the second guards 74 and 75 has an optimum length that allows the processing liquid (liquid chemical and rinsing liquid) scattering from the circumferential edge portion of the substrate W to be reliably captured by the first and the second guards 74 and 75.

Figure 5:
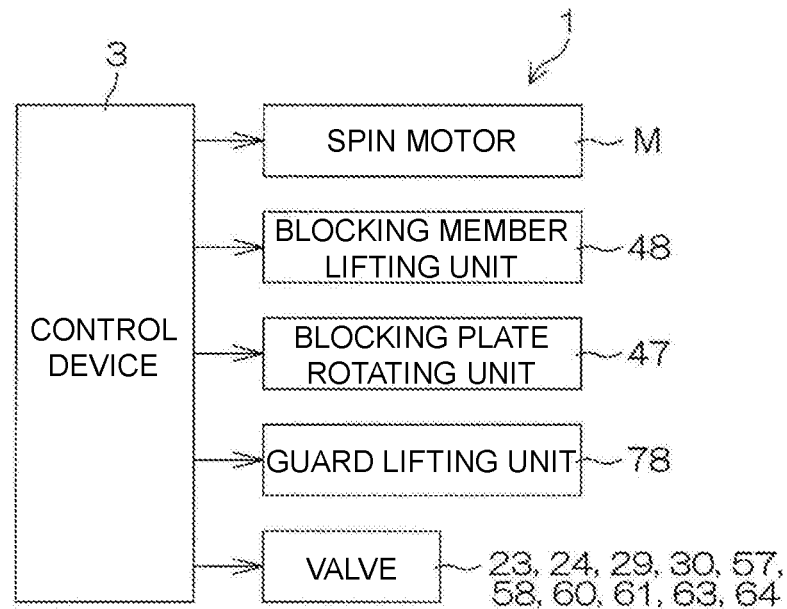
FIG. 5 is a block diagram for describing an electrical configuration of a main portion of the substrate processing apparatus.

FIG. 5 is a block diagram for describing an electrical configuration of a main portion of the substrate processing apparatus 1.

The control device 3 is configured using a microcomputer, for example. The control device 3 includes an arithmetic unit such as a central processing unit (CPU), a fixed memory device, a storage unit such as a hard disk drive, and an input/output unit. In the storage unit, programs executed by the arithmetic unit are stored.

Further, a spin motor M, a blocking member lifting unit 48, a blocking plate rotating unit 47, a guard lifting unit 78, and the like are connected to the control device 3 as objects to be controlled. The control device 3 controls operations of the spin motor M, the blocking member lifting unit 48, the blocking plate rotating unit 47, the guard lifting unit 78, and the like in accordance with predetermined programs.

Further, the control device 3 opens and closes the chemical liquid valve 23, the rinsing liquid valve 29, the organic solvent valve 57, the hydrophobic agent valve 60, the inert gas valve 63, and the like in accordance with the predetermined programs. In addition, the control device 3 adjusts an opening degree of the first flow rate regulating valve 24, the second flow rate regulating valve 30, the third flow rate regulating valve 58, the fourth flow rate regulating valve 61, the fifth flow rate regulating valve 64, and the like.

Hereinafter, a case in which the substrate W having a surface on which a pattern is formed, which is a device forming surface, is processed will be described.

Figure 6:
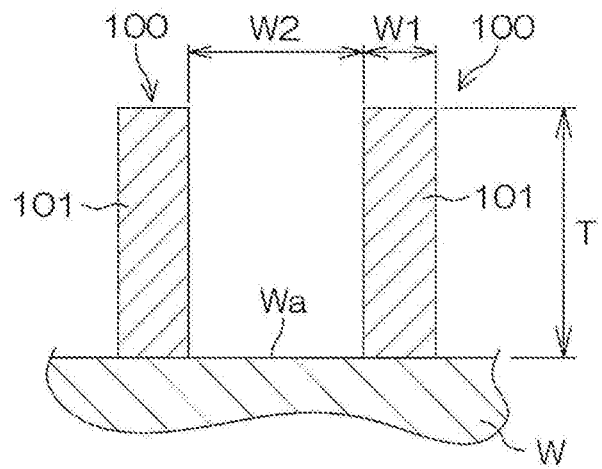
FIG. 6 is an enlarged cross-sectional view illustrating a surface of the substrate to be processed by the substrate processing apparatus.

FIG. 6 is an enlarged cross-sectional view illustrating a surface Wa of the substrate W to be processed by the substrate processing apparatus 1. The substrate W to be processed is, for example, a silicon wafer, and a pattern 100 is formed on the surface Wa which is a pattern forming surface thereof. The pattern 100 is a fine pattern, for example. As illustrated in FIG. 6, the pattern 100 may have structure bodies 101 having a convex shape (columnar shape) disposed in rows and columns. In this case, a line width W1 of each of the structure bodies 101 is, for example, about 10 nm to 45 nm, and a space width W2 of the pattern 100 is, for example, about 10 nm to several μm. A film thickness T of the pattern 100 is about 1 μm, for example. The pattern 100 may have, for example, an aspect ratio (a ratio of the film thickness T to the line width W1) of about 5 to 500, for example, (typically about 5 to 50).

Further, the pattern 100 may be a pattern in which line patterns formed by fine trenches that are aligned in a repeating manner. Further, the pattern 100 may be formed by providing a plurality of fine holes (voids or pores) in a thin film.

The pattern 100 includes an insulating film, for example. Further, the pattern 100 may include a conductor film. More specifically, the pattern 100 may be formed of a laminated film in which a plurality of films is laminated, and may further include an insulating film and a conductor film. The pattern 100 may be a pattern constituted by a single layer film. The insulating film may be a silicon oxide film ($SiO_2$ film) or a silicon nitride film (SiN film). Further, the conductor film may be an amorphous silicon film into which impurities for lowering resistance are introduced, or may be a metal film (for example, a metal interconnection film).

In addition, the pattern 100 may be a hydrophilic film. As the hydrophilic film, a tetraethyloxysilane (TEOS) film (a type of silicon oxide film) can be exemplified.

Figure 7:
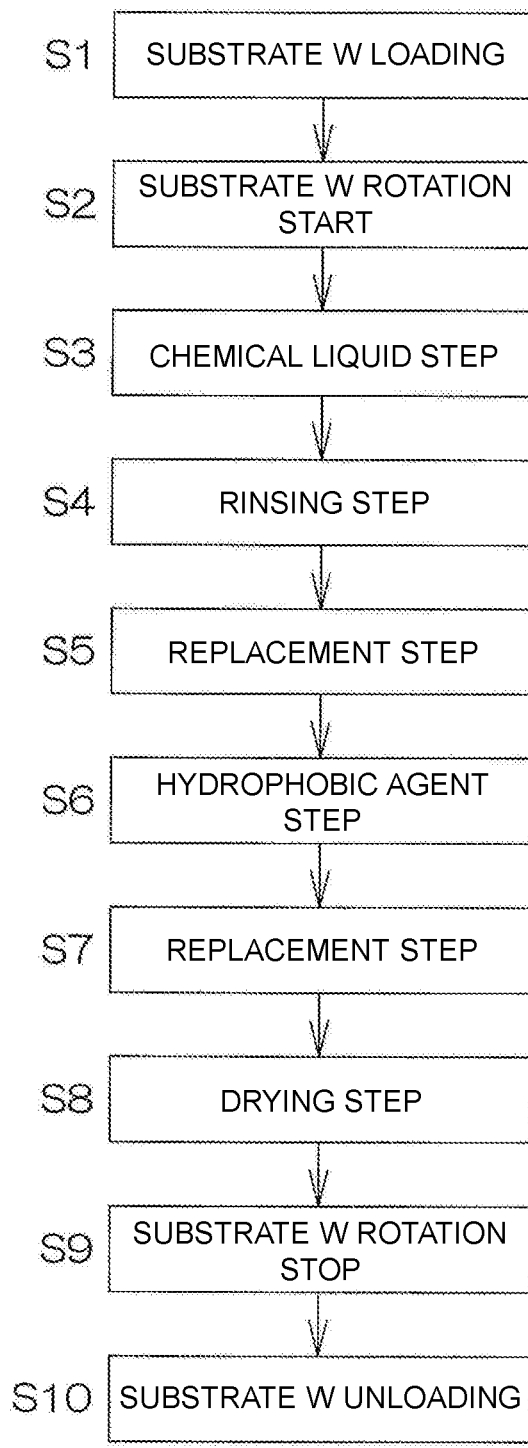
FIG. 7 is a flowchart for describing details of a substrate processing example executed in the processing unit.

FIG. 7 is a flowchart for describing details of a substrate processing example executed in the processing unit 2. FIGS. 8A to 8E are schematic views for describing the substrate processing example.

A first substrate processing example will be described with reference to FIGS. 1 to 7. FIGS. 8A to 8E may be referred to as appropriate.

The substrate W to be processed (for example, a circular substrate with a diameter of 300 mm) is conveyed into the processing unit 2 from a substrate container C by the indexer robot IR and the substrate conveying robot CR, loaded into the chamber 4, and then the substrate W is transferred to the spin chuck 5 with its surface Wa (see FIG. 6 or the like) facing upward and is held by the spin chuck 5 (S1 in FIG. 7: the substrate W loading). Loading of the substrate W into the chamber 4 is performed in a state in which the guards 74 to 77 are disposed at the lower position, and the chemical liquid nozzle 21 and the rinsing liquid nozzle 27 have retreated to the retreat position.

After the substrate conveying robot CR is retreated outside the processing unit 2, the control device 3 controls the spin motor M such that a rotation speed of the spin base 18 is raised to a predetermined liquid processing speed (within a range of about 10 to 1200 rpm, for example, about 800 rpm) and then the liquid processing speed is maintained (S2 in FIG. 7: substrate W rotation start).

When the rotation of the substrate W has reached the liquid processing speed, the control device 3 executes a chemical liquid step S3 (first processing step, see FIG. 7) in which the chemical liquid is supplied to the upper surface of the substrate W.

Figure 8A:
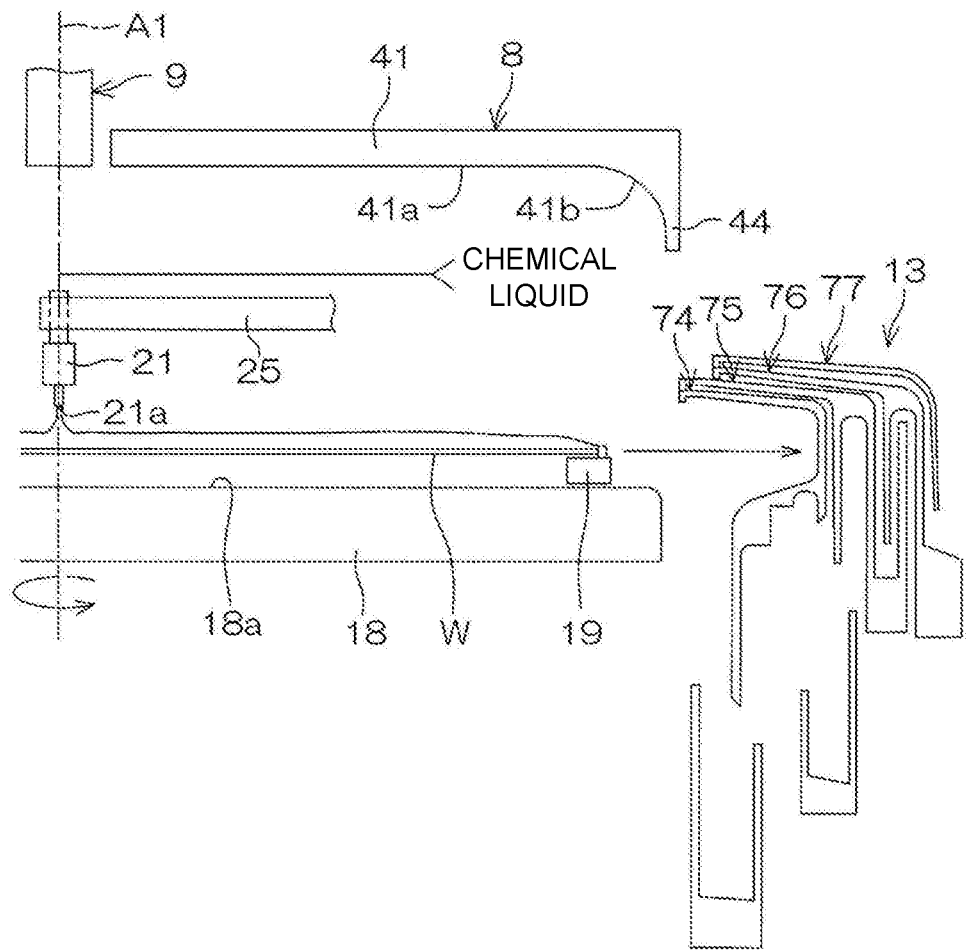
FIGS. 8A to 8E are schematic views for describing the substrate processing example.

Specifically, the control device 3 controls the first nozzle moving unit 26 such that the chemical liquid nozzle 21 is moved from the retreat position to the processing position. Thereby, the chemical liquid nozzle 21 is disposed above the substrate W. For example, as illustrated in FIG. 8A, the chemical liquid nozzle 21 may be disposed above a central portion of the upper surface of the substrate W.

Further, after the chemical liquid nozzle 21 is disposed at the processing position, the control device 3 controls the guard lifting unit 78 (see FIG. 2) such that the first to fourth guards 74 to 77 are raised to the upper position so that the first guard 74 is arranged to face the circumferential end surface of the substrate W (realization of the first guard facing state). That is, the chemical liquid step S3 is executed in the first guard facing state of the processing cup 13 while the blocking member 8 is disposed at the retreat position.

In the chemical liquid step S3, the control device 3 opens the chemical liquid valve 23. Thereby, the chemical liquid is discharged from the chemical liquid discharge port 21a of the chemical liquid nozzle 21 toward the upper surface of the substrate W (the surface Wa (see FIG. 6)) in a rotating state. The liquid chemical supplied to the upper surface of the substrate W is subjected to a centrifugal force due to the rotation of the substrate W and moves to the circumferential edge portion of the substrate W. As a result, the entire region of the upper surface of the substrate W is processed using the chemical liquid.

The chemical liquid moved to the circumferential edge portion of the substrate W scatters from the circumferential edge portion of the substrate W toward a side of the substrate W. The chemical liquid scattering from the circumferential edge portion of the substrate W is received by an inner wall of the first guard 74, flows down along the inner wall of the first guard 74, and is sent to the drainage treatment facility outside the apparatus via the first cup 71 and the first drain pipe 79 (see FIG. 2).

As described above, a position in the radial direction of the inner circumferential end 74a of the first guard 74 is provided such that a distance L2 in a radial direction between the circumferential edge portion of the substrate W and the first guard 74 has an optimum length that allows the chemical liquid scattering from the circumferential edge portion of the substrate W to be reliably captured by the first guard 74. Therefore, the chemical liquid discharged from the circumferential edge portion of the substrate W can be efficiently captured by the first guard 74.

When a predetermined period has elapsed from the start of the discharge of the chemical liquid, the control device 3 closes the chemical liquid valve 23 to stop the discharge of the chemical liquid from the chemical liquid nozzle 21. Thereby, the chemical liquid step S3 ends. Thereafter, the control device 3 controls the first nozzle moving unit 26 (see FIG. 2) to make the liquid chemical nozzle 21 return to the retreat position.

Figure 8B:
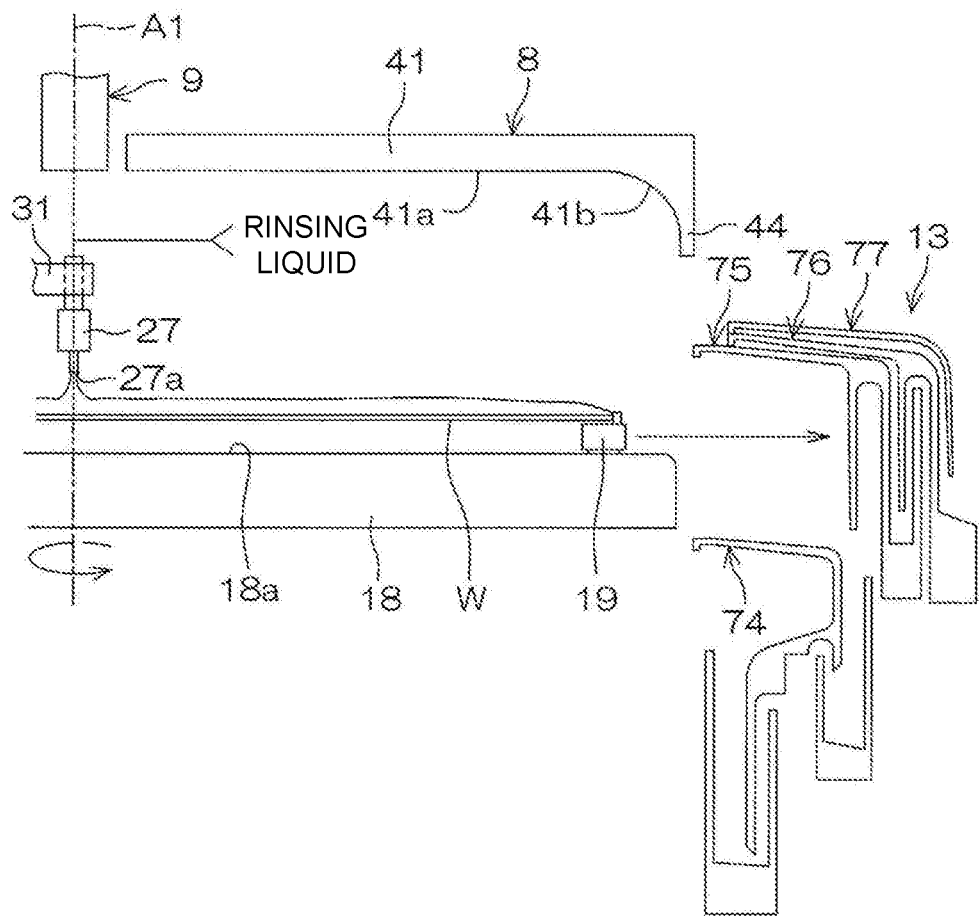

Next, the control device 3 executes a rinsing step S4 (first processing step. see FIG. 7) for replacing the chemical liquid on the substrate W with the rinsing liquid and removing the chemical liquid from the substrate W. Specifically, the control device 3 controls the second nozzle moving unit 32 (see FIG. 2) such that the rinsing liquid nozzle 27 is moved from the retreat position to the processing position. Thereby, the rinsing liquid nozzle 27 is disposed above the substrate W. For example, as illustrated in FIG. 8B, the rinsing liquid nozzle 27 may be disposed above the central portion of the upper surface of the substrate W. Further, the control device 3 controls the guard lifting unit 78 (see FIG. 2) such that the first guard 74 of the processing cup 13 in the first guard facing state is lowered to the lower position so that the second guard 75 is arranged to face the circumferential end surface of the substrate W (realization of the second guard facing state). That is, the rinsing step S4 is executed in the second guard facing state of the processing cup 13 while the blocking member 8 is disposed at the retreat position.

In the rinsing step S4, the control device 3 opens the rinsing liquid valve 29. Thereby, the rinsing liquid is discharged from the rinsing liquid discharge port 27a of the rinsing liquid nozzle 27 toward the upper surface of the substrate W (the surface Wa (see FIG. 6)) in a rotating state. The rinsing liquid supplied to the upper surface of the substrate W is subjected to a centrifugal force due to the rotation of the substrate W and moves to the circumferential edge portion of the substrate W. As a result, the chemical liquid that has adhered to the substrate W is washed away by the rinsing liquid.

The rinsing liquid scattered from the circumferential edge portion of the substrate W is discharged from the circumferential edge portion of the substrate W to a side of the substrate W. The rinsing liquid scattered from the circumferential edge portion of the substrate W is received by an inner wall of the second guard 75, flows down along the inner wall of the second guard 75, and is sent to the drainage treatment facility outside the apparatus via the second cup 72 and the second drain pipe 80.

As described above, a position in the radial direction of the inner circumferential end 75a of the second guard 75 is provided such that the distance L2 in the radial direction between the circumferential edge portion of the substrate W and the second guard 75 has an optimum length that allows the rinsing liquid scattering from the circumferential edge portion of the substrate W to be reliably captured by the second guard 75. Therefore, the rinsing liquid discharged from the circumferential edge portion of the substrate W can be efficiently captured by the second guard 75.

When a predetermined period has elapsed from the start of the discharge of the rinsing liquid, the control device 3 closes the rinsing liquid valve 29 to stop the discharge of the rinsing liquid from the rinsing liquid nozzle 27. Thereby, the rinsing step S4 ends. Thereafter, the control device 3 controls the second nozzle moving unit 32 such that the rinsing liquid nozzle 27 returns to the retreat position.

Next, the control device 3 executes a replacement step S5 (second processing step, see FIG. 7). The replacement step S5 is a step of replacing the rinsing liquid on the substrate W with an organic solvent (IPA in this example) having a lower surface tension than the rinsing liquid (water).

Figure 8C:
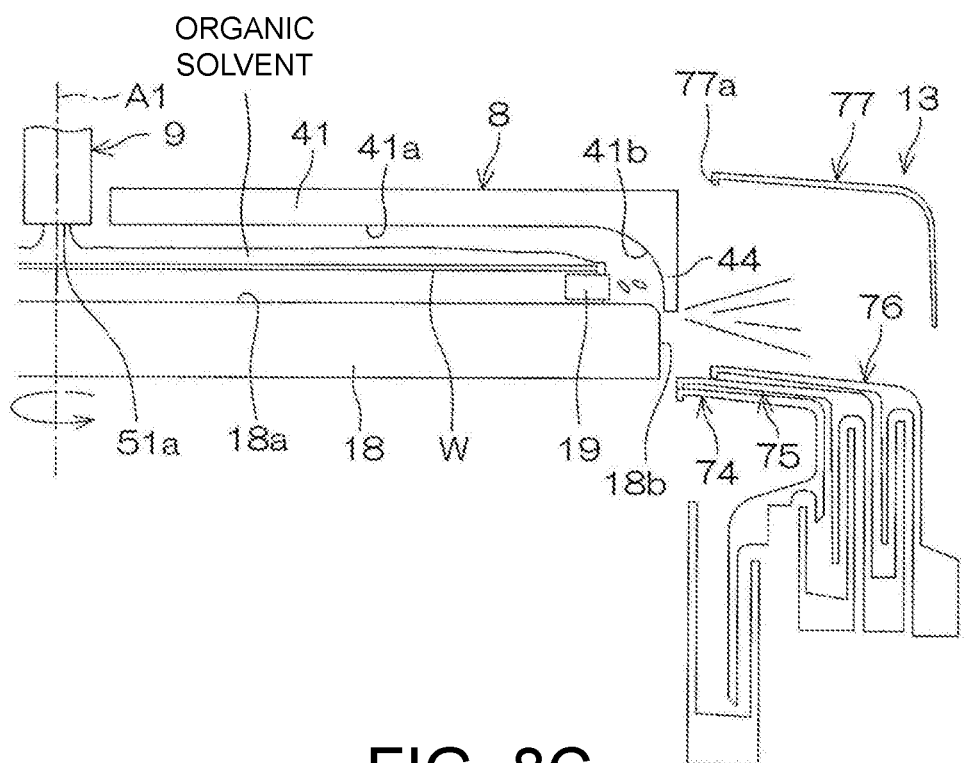

Specifically, the control device 3 controls the blocking member lifting unit 48 such that the blocking plate 41 is lowered so that the blocking plate 41 is disposed at the upper blocking position as illustrated in FIG. 8C. As a result, a blocking space is formed between the substrate facing surface 41a and the upper surface of the substrate W.

Further, the control device 3 controls the guard lifting unit 78 to make the fourth guard 77 to face the circumferential end surface of the substrate W (realization of the fourth guard facing state) by lowering the second guard 75 and the third guard 76 of the processing cup 13 in the second guard facing state to the lower position. That is, the replacement step S5 is executed in the fourth guard facing state of the processing cup 13 while the blocking member 8 is disposed at the upper blocking position. As described above, since the diameter D4 of the circumference defined by the inner circumferential end 77a of the fourth guard 77 is larger than the outer diameter D2 of the blocking member 8, interference between the blocking member 8 and the fourth guard 77 is avoided even when the processing cup 13 is in the fourth guard facing state.

In the replacement step S5, the control device 3 opens the organic solvent valve 57 while maintaining the rotation of the substrate W at a paddle speed. Thereby, as illustrated in FIG. 8C, an organic solvent is discharged from the first discharge port 51a of the central axis nozzle 9 toward the central portion of the upper surface of the substrate W. The organic solvent supplied to the central portion of the upper surface of the substrate W is subjected to a centrifugal force due to the rotation of the substrate W and moves to the circumferential edge portion of the substrate W. Thereby, the rinsing liquid on the upper surface of the substrate W is replaced with the organic solvent.

The organic solvent scatters from the circumferential edge portion of the substrate W toward the lateral side. The organic solvent scattered from the circumferential edge portion of the substrate W is received by the inner circumferential surface 41b of the blocking member 8 and then scatters from a lower end edge of the cylindrical portion 44 of the blocking plate 41 toward the lateral side. At this time, the organic solvent scatters at a wide angle from the lower end edge of the cylindrical portion 44 of the blocking plate 41. The scattered organic solvent is captured by an inner wall of the fourth guard 77. In this embodiment, as described above, since the diameter D3 of the circumference defined by the inner circumferential ends 74a and 75a of the first and the second guards 74 and 75 is substantially equal to the outer diameter D2 of the blocking member 8 (see FIG. 4, D3 D2), the organic solvent can be reliably prevented from entering the first or second guard 74 or 75 even when the organic solvent scatters from the blocking plate 41 at a wide angle. The captured organic solvent flows down the inner wall of the fourth guard 77, passes over a bottom wall of the chamber 4, and is sent to the drainage treatment facility outside the apparatus.

When a predetermined period has elapsed after the organic solvent valve 57 is opened, the control device 3 closes the organic solvent valve 57. Thereby, the replacement step S5 ends.

Next, the control device 3 executes a hydrophobic agent step S6 (second processing step, see FIG. 7). The hydrophobic agent step S6 is a step of supplying a liquid hydrophobic agent to the upper surface of the substrate W to replace the organic solvent on the upper surface of the substrate W with the hydrophobic agent.

Specifically, while maintaining a state in which the blocking plate 41 is disposed at the upper blocking position, the control device 3 controls the guard lifting unit 78 to make the third guard 76 to face the circumferential end surface of the substrate W (realization of the third guard facing state) by raising the third guard 76 of the processing cup 13 in the fourth guard facing state to the upper position. That is, the hydrophobic agent step S6 is executed in the third guard facing state of the processing cup 13 while the blocking member 8 is disposed at the upper blocking position. As described above, since the diameter D3 of the circumference defined by the inner circumferential end 76a of the third guard 76 is larger than the outer diameter D2 of the blocking member 8, interference between the blocking member 8 and the third guard 76 is avoided even when the processing cup 13 is in the third guard facing state.

Figure 8D:
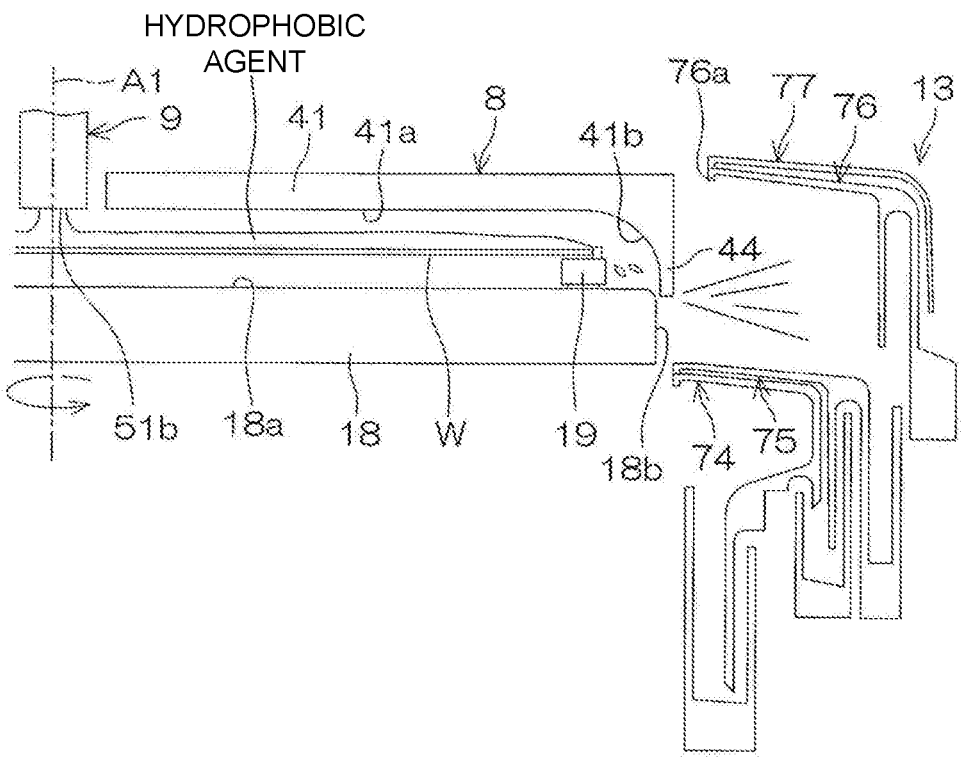

In the hydrophobic agent step S6, the control device 3 opens the hydrophobic agent valve 60 while maintaining the rotation of the substrate W at a paddle speed. Thereby, as illustrated in FIG. 8D, the hydrophobic agent is discharged from the second discharge port 52a of the central axis nozzle 9 toward the central portion of the upper surface of the substrate W. The organic solvent supplied to the central portion of the upper surface of the substrate W moves to the circumferential edge portion of the substrate W. As a result, the organic solvent on the upper surface of the substrate W is replaced with the hydrophobic agent.

The hydrophobic agent scatters from the circumferential edge portion of the substrate W toward the lateral side. The hydrophobic agent scattered from the circumferential edge portion of the substrate W is received by the inner circumferential surface 41b of the blocking member 8 and then scatters from the lower end edge of the cylindrical portion 44 of the blocking plate 41 toward the lateral side. At this time, the hydrophobic agent scatters at a wide angle from the lower end edge of the cylindrical portion 44 of the blocking plate 41. The scattered hydrophobic agent is captured by an inner wall of the third guard 76. In this embodiment, as described above, since the diameter D3 of the circumference defined by the inner circumferential ends 74a and 75a of the first and the second guards 74 and 75 is substantially equal to the outer diameter D2 of the blocking member 8 (see FIG. 4, D3 D2), the hydrophobic agent can be reliably prevented from entering the first or second guard 74 or 75 even when the hydrophobic agent scatters from the blocking plate 41 at a wide angle. The captured hydrophobic agent flows down the inner wall of the third guard 76, flows down the inner wall of the second guard 75, and is sent to the drainage treatment facility outside the apparatus via the second cup 72 and the third drain pipe 81 (see FIG. 2).

When a predetermined period has elapsed after the hydrophobic agent valve 60 is opened, the control device 3 closes the hydrophobic agent valve 60. Thereby, the hydrophobic agent step S6 ends.

Next, the control device 3 executes a replacement step S7 (second processing step, see FIG. 7). The replacement step S7 is a step of replacing the hydrophobic agent on the substrate W with an organic solvent (IPA in this example).

Specifically, while maintaining the state in which the blocking plate 41 is disposed at the upper blocking position, the control device 3 controls the guard lifting unit 78 to make the fourth guard 77 to face the circumferential end surface of the substrate W (realization of the fourth guard facing state) by lowering the third guard 76 of the processing cup 13 in the third guard facing state to the lower position.

In this state, the control device 3 opens the organic solvent valve 57 while maintaining the rotation speed of the substrate W at the liquid processing speed. Thereby, as illustrated in FIG. 8C, the organic solvent is discharged from the first discharge port 51a of the central axis nozzle 9 (the second nozzle pipe 52) toward the central portion of the upper surface of the substrate W. The organic solvent supplied to the central portion of the upper surface of the substrate W is subjected to a centrifugal force due to the rotation of the substrate W and moves to the circumferential edge portion of the substrate W. Thereby, the hydrophobic agent on the upper surface of the substrate W is replaced with the organic solvent.

The organic solvent scatters from the circumferential edge portion of the substrate W toward the lateral side. The organic solvent scattered from the circumferential edge portion of the substrate W is received by the inner circumferential surface 41b of the blocking member 8 and then scatters from the lower end edge of the cylindrical portion 44 of the blocking plate 41 toward the lateral side. The scattered organic solvent is received by the inner wall of the fourth guard 77, flows down along the inner wall of the fourth guard 77, passes over the bottom wall of the chamber 4, and is sent to the drainage treatment facility outside the apparatus.

When a predetermined period has elapsed after the organic solvent valve 57 is opened, the control device 3 closes the organic solvent valve 57. Thereby, the replacement step S7 ends.

Figure 8E:
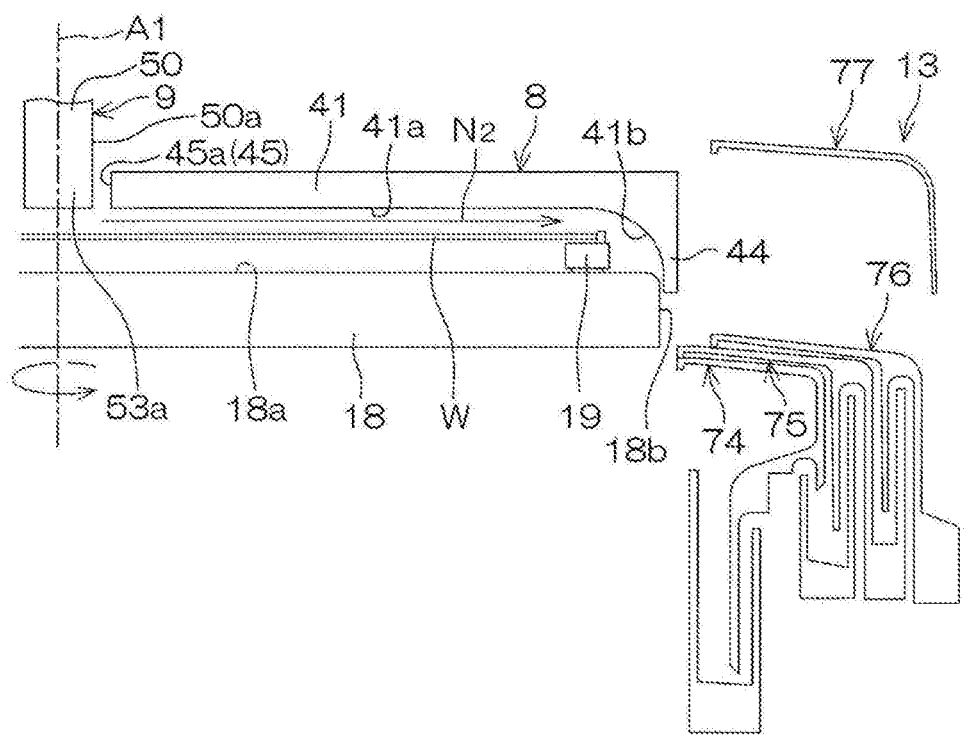

Next, a drying step S8 (second processing step, see FIG. 7) in which the substrate W is dried is performed. Specifically, while maintaining the state of the processing cup 13 in the fourth guard facing state, the control device 3 controls the blocking member lifting unit 48 such that the blocking plate 41 is lowered and the blocking plate 41 is disposed at the lower blocking position as illustrated in FIG. 8E. That is, the drying step S8 is executed in the fourth guard facing state of the processing cup 13 while the blocking member 8 is disposed at the lower blocking position.

In the drying step S8 of this substrate processing example, in a state in which the blocking plate 41 is disposed at the blocking position, the control device 3 controls the spin motor M such that the substrate W is accelerated to a drying rotation speed (for example, several thousand rpm) which is greater than the rotation speed in each of the chemical liquid step S3 to the replacement step S7 and then rotates the substrate W at the drying rotation speed. Thereby, a large centrifugal force is applied to the liquid on the substrate W, and the liquid that has adhered to the substrate W is shaken off around the substrate W.

Further, in the drying step S8, the control device 3 opens the inert gas valve 63. Thereby, as illustrated in FIG. 8E, an inert gas is discharged from the third discharge port 53a of the central axis nozzle 9 toward the central portion of the upper surface of the substrate W. The discharge flow rate of the inert gas at this time is, for example, 150 (liters/minute). That is, in the space, the inert gas discharged from the third discharge port 53a is supplied in addition to the inert gas that has been supplied until that time through a gap between the outer circumferential wall of the central axis nozzle 9 (the outer circumferential surface 50a of the casing 50) and a cylindrical inner circumferential surface 45a of the through hole 45.

When a predetermined period has elapsed from the acceleration of the substrate W, the control device 3 controls the spin motor M such that the rotation of the substrate W by the spin chuck 5 is stopped (step S9 in FIG. 7). Thereafter, the control device 3 controls the blocking member lifting unit 48 to raise the blocking plate 41 to be disposed at the retreat position.

Thereafter, the substrate W is unloaded from the chamber 4 (step S10 in FIG. 7). Specifically, the control device 3 causes a hand of the substrate conveying robot CR to enter the chamber 4. Then, the control device 3 causes the hand of the substrate conveying robot CR to hold the substrate W on the spin chuck 5. Thereafter, the control device 3 causes the hand of the substrate conveying robot CR to retreat from the inside of the chamber 4. Thereby, the processed substrate W is unloaded from the chamber 4, and a series of the substrate processing example ends. The unloaded substrate W is transferred from the substrate conveying robot CR to the indexer robot IR and stored in the substrate container C by the indexer robot IR.

As described above, according to this embodiment, the inner circumferential ends 76a and 77a of the third and the fourth guards 76 and 77 are positioned on an outer side in the radial direction of the inner circumferential ends 74a and 75a of the first and the second guards 74 and 75. That is, the diameter D4 of the circumference defined by the inner circumferential ends 76a and 77a of the third and the fourth guards 76 and 77 is larger than the diameter D3 of the circumference defined by the inner circumferential ends 74a and 75a of the first and the second guards 74 and 75 (D4>D3).

Thus, in the chemical liquid step S3 and the rinsing step S4, the blocking member 8 is disposed at the retreat position, and the first and the second guards 74 and 75 face the circumferential end surface of the substrate W. Since the inner circumferential ends 74a and 75a of the first and the second guards 74 and 75 are relatively small in diameter, the distance L2 in the radial direction between the circumferential edge portion of the substrate W and the first and the second guards 74 and 75 can be maintained at an optimum length. Therefore, the processing liquid (chemical liquid or rinsing liquid) scattering from the circumferential edge portion of the substrate W can be efficiently captured by the first or the second guard 74 or 75 (liquid splashing prevention performance improves).

In the replacement step S5 and the hydrophobic agent step S6, the blocking member 8 is disposed at the upper blocking position, and the third and the fourth guards 76 and 77 respectively face the lower end edge of the cylindrical portion 44 of the blocking member 8 disposed at the blocking position. Since the inner circumferential ends 76a and 77a of the third and the fourth guards 76 and 77 are relatively large in diameter, interference between the blocking member 8 and the third and the fourth guards 76 and 77 is avoided.

In the drying step S8, the blocking member 8 is disposed at the lower blocking position, and the fourth guard 77 faces the lower end edge of the cylindrical portion 44 of the blocking member 8 disposed at the lower blocking position. Since the inner circumferential end 77a of the fourth guard 77 is relatively large in diameter, interference between the blocking member 8 and the fourth guard 77 is avoided.

As described above, while avoiding interference between the blocking member 8 and the third and the fourth guards 76 and 77, the processing liquid discharged from the circumferential edge portion of the substrate W can be efficiently captured by a desired guard (the first and the second guards 74 and 75).

Also, since the diameter D3 of the circumference defined by the inner circumferential ends 74a and 75a of the first and the second guards 74 and 75 is substantially equal to the outer diameter D2 of the blocking member 8 (see FIG. 4, D3≈D2), in the replacement steps S5 and S7 and the hydrophobic agent step S6, it is possible to reliably prevent the processing liquid from entering the first or the second guard 74 or 75 even when the processing liquid (organic solvent or hydrophobic agent) scatters from the blocking plate 41 at a wide angle. As a result, occurrence of accidental mixing of the processing liquids in the first or second guard 74 or 75 can be prevented.

Although the embodiment of the disclosure has been described above, the disclosure can be implemented by other embodiments.

For example, although it describes that the diameter D3 of the circumference defined by the inner circumferential ends 74a and 75a of the first and the second guards 74 and 75 is substantially equal to the outer diameter D2 of the blocking member 8, the diameter D3 smaller than the outer diameter D2 of the blocking member 8 may be provided.

Further, in the embodiment described above, both the inner circumferential ends 76a and 77a of the third and the fourth guards 76 and 77 are made shorter than the other guards, but only the inner circumferential end 77a of the fourth guard 77 which is the outermost guard may be shortened. However, in this case, in a step (corresponding to the replacement steps S5 and S7 and the hydrophobic agent step S6 in the substrate processing example described above) executed in a state in which the blocking member 8 is disposed at the blocking position (the upper blocking position or the lower blocking position), it is necessary that the fourth guard 77 be always arranged to face the lower end edge of the cylindrical portion 44 of the blocking member 8 disposed at the blocking position.

Also, the position in the radial direction of the inner circumferential end 74a of the first guard 74 and the position in the radial direction of the inner circumferential end 75a of the second guard 75 may be different from each other. Further, the position in the radial direction of the inner circumferential end 76a of the third guard 76 and the position in the radial direction of the inner circumferential end 77a of the fourth guard 77 may be different from each other.

In addition, the inclined portions 86, 88, 90, and 92 of the respective guards 74 to 77 of the processing cup 13 may have cross-sectional shapes extending in the manner of drawing a smooth and upward convex arc, for example.

Further, although a case in which the processing cup 13 is a three-stage cup has been described as an example, the processing cup 13 may be a two-stage or three-stage cup as long as it has an inner side guard and an outer side guard, and may be a multi-stage cup of four stages or more.

Although the inner circumferential surface 41b of the blocking member 8 has been described as having an arc-shaped cross section, the inner circumferential surface 41b of the blocking member 8 may have a cross section in a bent shape (for example, bent at a right angle).

Further, in the above-described embodiment, a support type blocking member supported by the support arm 46 has been described as an example of the blocking member 8, but a driven type blocking member supported by the spin base 18 of the spin chuck 5 and rotating accompanying the rotation of the spin chuck 5 can also be employed.

Further, in the substrate processing step described above, at the end of the rinsing step, a paddle rinsing step in which the rotation speed of the substrate W is decelerated in stages from the liquid processing speed to a paddle speed (low rotation speed of zero or about 40 rpm or less, for example, about 10 rpm) and thereafter the rotation speed of the substrate W is maintained at the paddle speed may be executed.

In this case, so-called hole-making drying in which the substrate W is dried by making a hole in a paddle-shaped liquid film and spreading the hole to the entire region of the substrate W may be employed in the drying step S8.

Further, in the embodiment described above, although a case in which the substrate processing apparatus is an apparatus for processing the substrate W made of a semiconductor wafer has been described, the substrate processing apparatus may also be an apparatus for processing substrates such as substrates for a liquid crystal display device, substrates for a flat panel display (FPD) such as an organic electroluminescence (organic EL) display device, substrates for an optical disk, substrates for a magnetic disk, substrates for a magneto-optical disk, substrates for a photomask, ceramic substrates, substrates for a solar cell, and the like.

Other Configurations

The disclosure provides a substrate processing apparatus which applies processing with a processing liquid to a substrate. The substrate processing apparatus includes a substrate holding unit having a spin base to hold the substrate, a blocking member having a substrate facing surface which faces an upper surface of the substrate held by the substrate holding unit and having a diameter larger than the spin base; a blocking member lifting unit, raising and lowering the blocking member between a blocking position and a retreat position that is retreated upward from the blocking position, wherein at the blocking position a space between the substrate facing surface and the upper surface is blocked from a lateral side on the upper surface and at the retreat position the space is not blocked from the lateral side on the upper surface; and a plurality of guards including an inner side guard surrounding a periphery of the substrate holding unit and an outer side guard surrounding a periphery of the inner side guard to capture a processing liquid discharged from between the substrate and the blocking member, where the inner side guard and the outer side guard are cylindrical. An inner circumferential end of the outer side guard is positioned on a radial outer side of an inner circumferential end of the inner side guard.

According to this configuration, the inner circumferential end of the outer side guard is positioned on the outer side in the radial direction of the inner circumferential end of the inner side guard. That is, the diameter of a circumference defined by the inner circumferential end of the outer side guard is larger than the diameter of a circumference defined by the inner circumferential end of the inner side guard.

It is considered that the blocking member and the plurality of guards are provided in a state in which the blocking member is disposed at the retreat position and the inner side guard faces a circumferential end surface of the substrate. In this state, since the inner circumferential end of the inner side guard has a relatively small diameter, a radial distance between a circumferential edge portion of the substrate and the inner circumferential end of the inner side guard can be maintained at an optimum length. Therefore, the processing liquid discharged from the circumferential edge portion of the substrate can be efficiently captured by the inner side guard (liquid splashing prevention performance improves).

In addition, it is considered that the blocking member and the plurality of guards are provided in a state in which the blocking member is disposed at the blocking position and the outer side guard faces the circumferential end of the blocking member. Since the inner circumferential end of the outer side guard has a relatively large diameter, in this state, interference between the outer side guard and the blocking member is avoided.

As described above, while avoiding interference between the blocking member and the guard (outer side guard), the processing liquid discharged from the circumferential edge portion of the substrate can be efficiently captured by a desired guard (inner side guard).

In one embodiment, the inner side guard, the outer side guard, and the blocking member may be provided so that the diameter of the circumference defined by the inner circumferential end of the outer side guard is larger than an outer diameter of the blocking member, and the diameter of the circumference defined by the inner circumferential end of the inner side guard is equal to or smaller than the outer diameter of the blocking member.

According to this configuration, the diameter of the circumference defined by the inner circumferential end of the outer side guard is larger than the outer diameter of the blocking member. Therefore, interference between the outer side guard and the blocking member is reliably avoided.

Further, the diameter of the circumference defined by the inner circumferential end of the inner side guard is equal to or smaller than the outer diameter of the blocking member. Therefore, it is possible to reliably prevent the processing liquid discharged from the circumferential end portion of the substrate from entering the inner side guard, and thereby accidental mixing of the processing liquid in the inner side guard can be prevented.

In one embodiment, the blocking member may further include an inner circumferential surface that faces a circumferential end of the substrate held by the substrate holding unit.

According to this configuration, an upper space above the substrate and a lateral side space of the upper space can be more effectively blocked by the blocking member in a state in which the blocking member is disposed at the blocking position. In this state, the outer side guard is arranged to face the circumferential end of the blocking member. The processing liquid discharged from the circumferential edge portion of the upper surface of the substrate is received by the inner circumferential surface. The processing liquid scatters outward in a radial direction from the lower end edge of the inner circumferential surface of the blocking member at a wide angle. Although the blocking member having such an inner circumferential surface has a larger diameter than the spin base, even when using such a blocking member with a large diameter, it is possible to efficiently capture the processing liquid discharged from the circumferential edge portion of the substrate with a desired guard while avoiding interference between the blocking member and the guard.

In one embodiment, the inner side guard and the outer side guard may respectively have an inclined portion directed upward toward an inner side in a radial direction. The inclined portion of the outer side guard may be disposed above the inclined portion of the inner side guard, and an upper end of each inclined portion may form an inner circumferential end of each of the inner side guard and the outer side guard.

According to this configuration, the inclined portion of the outer side guard is disposed above the inclined portion of the inner side guard. The upper end of each inclined portion forms the inner circumferential end of each guard.

In one embodiment, substrate processing apparatus may further include a rotation unit rotating the substrate held by the substrate holding unit around a predetermined rotation axis, a guard lifting unit raising and lowering at least one of the plurality of guards, and a control device controlling the blocking member lifting unit, the rotation unit, and the guard lifting unit. Also, the control device may execute a first processing step of rotating the substrate around the rotation axis by the rotation unit in a state in which the blocking member is disposed at the retreat position by the blocking member lifting unit and the inner side guard among the plurality of guards is disposed to face a circumferential end surface of the substrate by the guard lifting unit, and a second processing step of rotating the substrate around the rotation axis by the rotation unit in a state in which the blocking member is disposed at the blocking position by the blocking member lifting unit and the outer side guard among the plurality of guards is disposed to face the circumferential end surface of the substrate by the guard lifting unit.

According to this configuration, the inner circumferential end of the outer side guard is positioned on a radial outer side of the inner circumferential end of the inner side guard. That is, the diameter of the circumference defined by the inner circumferential end of the outer side guard is larger than the diameter of the circumference defined by the inner circumferential end of the inner side guard.

Further, in the first processing step, the blocking member is disposed at the retreat position, and the inner side guard faces the circumferential end surface of the substrate. Since the inner circumferential end of the inner side guard has a relatively small diameter, the radial distance between the circumferential edge portion of the substrate and the inner circumferential end of the inner side guard can be maintained at an optimum length. Therefore, the processing liquid discharged from the circumferential edge portion of the substrate can be efficiently captured by the inner side guard (liquid splashing prevention performance improves).

In the second processing step, the blocking member is disposed at the blocking position, and the outer side guard faces the circumferential end of the blocking member. Since the inner circumferential end of the outer side guard has a relatively large diameter, interference between the outer side guard and the blocking member is avoided.

As described above, while avoiding interference between the blocking member and the guard (outer side guard), the processing liquid discharged from the circumferential edge portion of the substrate can be efficiently captured by a desired guard (inner side guard).

In one embodiment, the substrate processing apparatus may further include a first nozzle including a first processing liquid discharge port provided outside the blocking member, and a first processing liquid unit supplying a first processing liquid to the first nozzle. Also, the control device may further execute a step of discharging the first processing liquid from the first processing liquid discharge port toward the upper surface of the substrate by the first processing liquid unit in the first processing step.

According to this configuration, in the first processing step in which the blocking member is disposed at the retreat position and the inner side guard is arranged to face the circumferential end surface of the substrate, the first processing liquid is discharged from the first processing liquid discharge port provided outside the blocking member toward the upper surface of the substrate. The first processing liquid supplied to the upper surface of the substrate moves to the circumferential edge portion of the upper surface of the substrate due to a centrifugal force due to rotation of the substrate and scatters outward in a radial direction from the circumferential edge portion of the upper surface of the substrate. The scattered first processing liquid is captured by the inner side guard. Since the inner circumferential end of the inner side guard has a relatively small diameter, the radial distance between the circumferential edge portion of the substrate and the inner circumferential end of the inner side guard can be maintained at an optimum length. Therefore, the first processing liquid discharged from the circumferential edge portion of the substrate can be efficiently captured by the inner side guard.

In one embodiment, the substrate processing apparatus may further include a second nozzle including a second processing liquid discharge port that is open to the substrate facing surface, and a second processing liquid unit supplying a second processing liquid to the second nozzle. The control device may further execute a step of discharging the second processing liquid from the second processing liquid discharge port toward the upper surface of the substrate by the second processing liquid unit in the second processing step.

According to this configuration, in the second processing step in which the blocking member is disposed at the blocking position and the outer side guard is arranged to face the circumferential end of the blocking member, the second processing liquid is discharged from the second processing liquid discharge port that is open to the substrate facing surface toward the upper surface of the substrate. The second processing liquid supplied to the upper surface of the substrate moves to the circumferential edge portion of the upper surface of the substrate due to a centrifugal force due to rotation of the substrate and scatters outward in a radial direction from the circumferential edge portion of the upper surface of the substrate. The scattered second processing liquid is captured by the outer side guard. Since the inner circumferential end of the outer side guard has a relatively large diameter, in this state, interference between the outer side guard and the blocking member is avoided.

The disclosure provides a method of processing a substrate implemented in a substrate processing apparatus that includes a substrate holding unit having a spin base to hold a substrate. The method of processing a substrate includes a first processing step and a second processing step. The first processing step is to rotate the substrate around a predetermined rotation axis in a state that a blocking member is disposed at a retreat position and an inner side guard among a plurality of guards is disposed to face a circumferential end surface of the substrate. The blocking member has a diameter larger than the spin base and faces an upper surface of the substrate, and the retreat position represents being retreated from the upper surface of the substrate. The plurality of guards includes the inner side guard surrounding a periphery of the substrate holding unit and an outer side guard surrounding a periphery of the inner side guard, and the outer side guard has an inner circumferential end positioned on an outer side in a radial direction of an inner circumferential end of the inner side guard, where the inner side guard and the outer side guard are cylindrical. The second processing step is to rotate the substrate around the rotation axis in a state that the blocking member is disposed at a blocking position at which a space between a substrate facing surface and the upper surface is blocked from a lateral side on the upper surface and the outer side guard among the plurality of guards is disposed to face a circumferential end of the blocking member positioned at the blocking position.

According to this method, the inner circumferential end of the outer side guard is positioned on the radial outer side in the radial direction of the inner circumferential end of the inner side guard. That is, the diameter of a circumference defined by the inner circumferential end of the outer side guard is larger than the diameter of the circumference defined by the inner circumferential end of the inner side guard.

Further, in the first processing step, the blocking member is disposed at the retreat position and the inner side guard faces a circumferential end surface of the substrate. Since the inner circumferential end of the inner side guard has a relatively small diameter, the distance in the radial direction between a circumferential edge portion of the substrate and the inner circumferential end of the inner side guard can be maintained at an optimum length. Therefore, the processing liquid discharged from the circumferential edge portion of the substrate can be efficiently captured by the inner side guard (liquid splashing prevention performance improves).

In the second processing step, the blocking member is disposed at the blocking position and the outer side guard faces the circumferential end of the blocking member. Since the inner circumferential end of the outer side guard has a relatively large diameter, interference between the outer side guard and the blocking member is avoided.

As described above, while avoiding interference between the blocking member and the guard (outer side guard), the processing liquid discharged from the circumferential edge portion of the substrate can be efficiently captured by a desired guard (inner side guard).

In one embodiment, the first processing step of the method of processing a substrate may further include a step of discharging a first processing liquid from a first processing liquid discharge port provided outside the blocking member toward the upper surface of the substrate.

According to this method, in the first processing step in which the blocking member is disposed at the retreat position and the inner side guard is arranged to face the circumferential end surface of the substrate, the first processing liquid is discharged from the first processing liquid discharge port provided outside the blocking member toward the upper surface of the substrate. The first processing liquid supplied to the upper surface of the substrate moves to the circumferential edge portion of the upper surface of the substrate due to a centrifugal force due to rotation of the substrate and scatters outward in a radial direction from the circumferential edge portion of the upper surface of the substrate. The scattered first processing liquid is captured by the inner side guard. Since the inner circumferential end of the inner side guard has a relatively small diameter, the radial distance between the circumferential edge portion of the substrate and the inner circumferential end of the inner side guard can be maintained at an optimum length. Therefore, the first processing liquid discharged from the circumferential edge portion of the substrate can be efficiently captured by the inner side guard.

In one embodiment, the second processing step may further include a step of discharging a second processing liquid from a second processing liquid discharge port that is open to the substrate facing surface toward the upper surface of the substrate.

According to this method, in the second processing step in which the blocking member is disposed at the blocking position and the outer side guard is arranged to face the circumferential end of the blocking member, the second processing liquid is discharged from the second processing liquid discharge port that is open to the substrate facing surface toward the upper surface of the substrate. The second processing liquid supplied to the upper surface of the substrate moves to the circumferential edge portion of the upper surface of the substrate due to a centrifugal force due to rotation of the substrate and scatters outward in a radial direction from the circumferential edge portion of the upper surface of the substrate. The scattered second processing liquid is captured by the outer side guard. Since the inner circumferential end of the outer side guard has a relatively large diameter, in this state, interference between the outer side guard and the blocking member is avoided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A substrate processing apparatus which processes a substrate with a processing liquid, comprising:
   a substrate holding unit, having a spin base to hold the substrate;
   a blocking member, having a substrate facing surface which faces an upper surface of the substrate held by the substrate holding unit and having a diameter larger than the spin base;
   a blocking member lifting unit, raising and lowering the blocking member between a blocking position and a retreat position that is retreated upward from the blocking position, wherein at the blocking position a space between the substrate facing surface and the upper surface is blocked from a lateral side on the upper surface and at the retreat position the space is not blocked from the lateral side on the upper surface; and
   a plurality of guards, including an inner side guard surrounding a periphery of the substrate holding unit and an outer side guard surrounding a periphery of the inner side guard to capture a processing liquid discharged from between the substrate and the blocking member, where the inner side guard and the outer side guard are cylindrical,
   wherein an inner circumferential end of the outer side guard is positioned on an outer side in a radial direction of an inner circumferential end of the inner side guard,
   wherein the blocking member includes a disc portion and a cylindrical portion that extends downward from an outer circumferential portion of the disc portion,
   wherein a diameter of a circumference defined by the inner circumferential end of the outer side guard is larger than an outer diameter of the cylindrical portion of the blocking member, and a diameter of a circumference defined by the inner circumferential end of the inner side guard is equal to or smaller than the outer diameter of the cylindrical portion of the blocking member.

2. The substrate processing apparatus according to claim 1, wherein the blocking member further includes an inner circumferential surface that faces a circumferential end of the substrate held by the substrate holding unit.

3. The substrate processing apparatus according to claim 1, wherein
the inner side guard and the outer side guard respectively have an inclined portion directed upward toward an inner side in a radial direction;
the inclined portion of the outer side guard is disposed above the inclined portion of the inner side guard; and
an upper end of each inclined portion forms the inner circumferential end of each of the inner side guard and the outer side guard.

4. The substrate processing apparatus according to claim 1, further comprising:
a rotation unit, rotating the substrate held by the substrate holding unit around a predetermined rotation axis,
a guard lifting unit, raising and lowering at least one of the plurality of guards; and
a control device, controlling the blocking member lifting unit, the rotation unit, and the guard lifting unit,
wherein the control device executes:
a first processing step of rotating the substrate around the rotation axis by the rotation unit in a state in which the blocking member is disposed at the retreat position by the blocking member lifting unit and the inner side guard among the plurality of guards is disposed to face a circumferential end surface of the substrate by the guard lifting unit; and
a second processing step of rotating the substrate around the rotation axis by the rotation unit in a state in which the blocking member is disposed at the blocking position by the blocking member lifting unit and the outer side guard among the plurality of guards is disposed to face the circumferential end surface of the substrate by the guard lifting unit.

5. The substrate processing apparatus according to claim 4, further comprising:
a first nozzle, including a first processing liquid discharge port provided outside the blocking member; and
a first processing liquid unit, supplying a first processing liquid to the first nozzle,
wherein the control device further executes a step of discharging the first processing liquid from the first processing liquid discharge port toward the upper surface of the substrate by the first processing liquid unit in the first processing step.

6. The substrate processing apparatus according to claim 4, further comprising:
a second nozzle, including a second processing liquid discharge port that is open to the substrate facing surface; and
a second processing liquid unit, supplying a second processing liquid to the second nozzle,
wherein the control device further executes a step of discharging the second processing liquid from the second processing liquid discharge port toward the upper surface of the substrate by the second processing liquid unit in the second processing step.

7. The substrate processing apparatus according to claim 1, wherein the inner circumferential end of the inner side guard is always located below the cylindrical portion of the blocking member, the inner circumferential end of the outer side guard is moved between a position below a lower end of the cylindrical portion of the blocking member and a position above the lower end of the cylindrical portion of the blocking member while the blocking member is located at the blocking position.

* * * * *